US008294180B2

(12) United States Patent
Doyle et al.

(10) Patent No.: US 8,294,180 B2
(45) Date of Patent: Oct. 23, 2012

(54) CMOS DEVICES WITH A SINGLE WORK FUNCTION GATE ELECTRODE AND METHOD OF FABRICATION

(75) Inventors: Brian S. Doyle, Portland, OR (US);
Been-Yih Jin, Lake Oswego, OR (US);
Jack T. Kavalieros, Portland, OR (US);
Suman Datta, Beaverton, OR (US);
Justin K. Brask, Portland, OR (US);
Robert S. Chau, Beaverton, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 13/038,190

(22) Filed: Mar. 1, 2011

(65) Prior Publication Data
US 2011/0180851 A1 Jul. 28, 2011

Related U.S. Application Data

(60) Continuation of application No. 11/238,447, filed on Sep. 28, 2005, now abandoned, and a division of application No. 11/649,545, filed on Jan. 3, 2007, now Pat. No. 7,902,014.

(51) Int. Cl.
H01L 29/66 (2006.01)
(52) U.S. Cl. .................. 257/192; 257/E29.242
(58) Field of Classification Search .................. 257/192, 257/E29.242
See application file for complete search history.

(56) References Cited

U.S. PATENT DOCUMENTS

| | | |
|---|---|---|
| 4,231,149 A | 11/1980 | Chapman et al. |
| 4,487,652 A | 12/1984 | Almgren |
| 4,711,701 A | 12/1987 | McLevige |
| 4,751,201 A | 6/1988 | Nottenburg et al. |
| 4,818,715 A | 4/1989 | Chao |
| 4,871,692 A | 10/1989 | Lee et al. |
| 4,872,046 A | 10/1989 | Morkoc et al. |
| 4,905,063 A | 2/1990 | Beltram et al. |
| 4,906,589 A | 3/1990 | Chao |
| 4,907,048 A | 3/1990 | Huang |
| 4,914,059 A | 4/1990 | Nissim et al. |
| 4,994,873 A | 2/1991 | Madan |
| 4,996,574 A | 2/1991 | Shirasaka |
| 5,023,203 A | 6/1991 | Choi |
| 5,120,666 A | 6/1992 | Gotou |
| 5,124,777 A | 6/1992 | Lee |
| 5,179,037 A | 1/1993 | Seabaugh |
| 5,216,271 A | 6/1993 | Takagi et al. |
| 5,278,102 A | 1/1994 | Horie |
| 5,308,999 A | 5/1994 | Gotou |
| 5,328,810 A | 7/1994 | Lowrey et al. |
| 5,338,959 A | 8/1994 | Kim et al. |
| 5,346,836 A | 9/1994 | Manning et al. |
| 5,346,839 A | 9/1994 | Sundaresan |
| 5,357,119 A | 10/1994 | Wang et al. |
| 5,391,506 A | 2/1995 | Tada et al. |
| 5,428,237 A | 6/1995 | Yuzurihara et al. |
| 5,466,621 A | 11/1995 | Hisamoto et al. |
| 5,475,869 A | 12/1995 | Gomi et al. |
| 5,479,033 A | 12/1995 | Baca et al. |
| 5,482,877 A | 1/1996 | Rhee |
| 5,495,115 A | 2/1996 | Kudo et al. |
| 5,514,885 A | 5/1996 | Myrick |
| 5,521,859 A | 5/1996 | Ema et al. |
| 5,543,351 A | 8/1996 | Yoshihiko et al. |
| 5,545,586 A | 8/1996 | Koh |
| 5,563,077 A | 10/1996 | Ha |
| 5,576,227 A | 11/1996 | Hsu |
| 5,578,513 A | 11/1996 | Maegawa |
| 5,595,919 A | 1/1997 | Pan |
| 5,595,941 A | 1/1997 | Okarnoto et al. |
| 5,652,454 A | 7/1997 | Iwamatsu et al. |
| 5,658,806 A | 8/1997 | Lin et al. |
| 5,665,203 A | 9/1997 | Lee et al. |
| 5,682,048 A | 10/1997 | Shinohara et al. |
| 5,698,869 A | 12/1997 | Yoshimi et al. |
| 5,701,016 A | 12/1997 | Burroughes et al. |
| 5,716,879 A | 2/1998 | Choi et al. |
| 5,739,544 A | 4/1998 | Koichiro et al. |
| 5,760,442 A | 6/1998 | Shigyo et al. |
| 5,770,513 A | 6/1998 | Okaniwa et al. |
| 5,773,331 A | 6/1998 | Solomon et al. |

(Continued)

FOREIGN PATENT DOCUMENTS

DE 102039978 8/2003

(Continued)

OTHER PUBLICATIONS

International Search Report from PCT/US 03/26242 mailed on Jan. 26, 2004, 8 pgs.
International Search Report from PCT/US 03/39727 mailed on Apr. 27, 2004, 6 pgs.
International Search Report and Written Opinion from PCT/US2005/010505 mailed Aug. 26, 2005, 24 pgs.
International Preliminary Report on Patentability from PCT/US/2006/044601, mailed Jun. 12, 2008, 11 pgs.

(Continued)

Primary Examiner — Zandra Smith
Assistant Examiner — Marvin Payen
(74) Attorney, Agent, or Firm — Blakely, Sokoloff, Taylor & Zafman LLP

(57) ABSTRACT

Described herein are a device utilizing a gate electrode material with a single work function for both the pMOS and nMOS transistors where the magnitude of the transistor threshold voltages is modified by semiconductor band engineering and article made thereby. Further described herein are methods of fabricating a device formed of complementary (pMOS and nMOS) transistors having semiconductor channel regions which have been band gap engineered to achieve a low threshold voltage.

14 Claims, 6 Drawing Sheets

U.S. PATENT DOCUMENTS

| | | |
|---|---|---|
| 5,776,821 A | 7/1998 | Haskell et al. |
| 5,793,088 A | 8/1998 | Choi et al. |
| 5,804,848 A | 9/1998 | Mukai |
| 5,811,324 A | 9/1998 | Yang |
| 5,814,895 A | 9/1998 | Hirayama et al. |
| 5,821,629 A | 10/1998 | Wen et al. |
| 5,827,769 A | 10/1998 | Aminzadeh et al. |
| 5,844,278 A | 12/1998 | Mizuno et al. |
| 5,856,225 A | 1/1999 | Lee et al. |
| 5,859,456 A | 1/1999 | Efland et al. |
| 5,880,015 A | 3/1999 | Hata |
| 5,883,564 A | 3/1999 | Partin |
| 5,888,309 A | 3/1999 | Yu |
| 5,889,304 A | 3/1999 | Watanabe |
| 5,899,710 A | 5/1999 | Mukai |
| 5,905,285 A | 5/1999 | Garnder et al. |
| 5,908,313 A | 6/1999 | Chau et al. |
| 5,952,701 A | 9/1999 | Bulucea |
| 5,965,914 A | 10/1999 | Miyamoto |
| 5,976,767 A | 11/1999 | Li |
| 5,981,400 A | 11/1999 | Lo |
| 5,985,726 A | 11/1999 | Yu et al. |
| 6,013,926 A | 1/2000 | Oku et al. |
| 6,018,176 A | 1/2000 | Lim |
| 6,031,249 A | 2/2000 | Yamazaki et al. |
| 6,051,452 A | 4/2000 | Shigyo et al. |
| 6,054,355 A | 4/2000 | Inumiya et al. |
| 6,063,675 A | 5/2000 | Rodder |
| 6,063,677 A | 5/2000 | Rodder et al. |
| 6,066,869 A | 5/2000 | Noble et al. |
| 6,087,208 A | 7/2000 | Krivokapic et al. |
| 6,093,621 A | 7/2000 | Tseng |
| 6,114,201 A | 9/2000 | Wu |
| 6,114,206 A | 9/2000 | Yu |
| 6,117,697 A | 9/2000 | Seaford et al. |
| 6,117,741 A | 9/2000 | Chatterjee et al. |
| 6,120,846 A | 9/2000 | Hintermaier et al. |
| 6,133,593 A | 10/2000 | Boos et al. |
| 6,144,072 A | 11/2000 | Iwamatsu et al. |
| 6,150,222 A | 11/2000 | Gardner et al. |
| 6,153,485 A | 11/2000 | Pey et al. |
| 6,163,053 A | 12/2000 | Kawashima |
| 6,165,880 A | 12/2000 | Yaung et al. |
| 6,174,820 B1 | 1/2001 | Habermehl et al. |
| 6,190,975 B1 | 2/2001 | Kubo et al. |
| 6,200,865 B1 | 3/2001 | Gardner et al. |
| 6,218,309 B1 | 4/2001 | Miller et al. |
| 6,251,729 B1 | 6/2001 | Montree et al. |
| 6,251,763 B1 | 6/2001 | Inumiya et al. |
| 6,252,262 B1 | 6/2001 | Jonker et al. |
| 6,252,284 B1 | 6/2001 | Muller et al. |
| 6,259,135 B1 | 7/2001 | Hsu et al. |
| 6,261,921 B1 | 7/2001 | Yen et al. |
| 6,262,456 B1 | 7/2001 | Yu et al. |
| 6,274,503 B1 | 8/2001 | Hsieh |
| 6,287,924 B1 | 9/2001 | Chao et al. |
| 6,294,416 B1 | 9/2001 | Wu |
| 6,307,235 B1 | 10/2001 | Forbes et al. |
| 6,310,367 B1 | 10/2001 | Yagishita et al. |
| 6,317,444 B1 | 11/2001 | Chakrabarti et al. |
| 6,319,807 B1 | 11/2001 | Yeh et al. |
| 6,320,212 B1 | 11/2001 | Chow |
| 6,335,251 B2 | 1/2002 | Miyano et al. |
| 6,358,800 B1 | 3/2002 | Tseng |
| 6,359,311 B1 | 3/2002 | Colinge et al. |
| 6,362,111 B1 | 3/2002 | Laaksonen et al. |
| 6,368,923 B1 | 4/2002 | Huang |
| 6,376,317 B1 | 4/2002 | Forbes et al. |
| 6,383,882 B1 | 5/2002 | Lee et al. |
| 6,387,820 B1 | 5/2002 | Sanderfer |
| 6,391,782 B1 | 5/2002 | Yu |
| 6,396,108 B1 | 5/2002 | Krivokapic et al. |
| 6,399,970 B2 | 6/2002 | Kubo et al. |
| 6,403,434 B1 | 6/2002 | Yu |
| 6,403,981 B1 | 6/2002 | Yu |
| 6,406,795 B1 | 6/2002 | Hwang et al. |
| 6,407,442 B2 | 6/2002 | Inoue et al. |
| 6,413,802 B1 | 7/2002 | Hu et al. |
| 6,413,877 B1 | 7/2002 | Annapragada |
| 6,424,015 B1 | 7/2002 | Ishibashi et al. |
| 6,437,550 B2 | 8/2002 | Andoh et al. |
| 6,458,662 B1 | 10/2002 | Yu |
| 6,459,123 B1 | 10/2002 | Enders et al. |
| 6,465,290 B1 | 10/2002 | Suguro et al. |
| 6,472,258 B1 | 10/2002 | Adkisson et al. |
| 6,475,869 B1 | 11/2002 | Yu |
| 6,475,890 B1 | 11/2002 | Yu |
| 6,479,866 B1 | 11/2002 | Xiang |
| 6,483,146 B2 | 11/2002 | Lee et al. |
| 6,483,151 B2 | 11/2002 | Wakabayashi et al. |
| 6,483,156 B1 | 11/2002 | Adkisson et al. |
| 6,495,403 B1 | 12/2002 | Skotnicki et al. |
| 6,498,096 B2 | 12/2002 | Bruce et al. |
| 6,500,767 B2 | 12/2002 | Chiou et al. |
| 6,501,141 B1 | 12/2002 | Leu |
| 6,506,692 B2 | 1/2003 | Andideh |
| 6,525,403 B2 | 2/2003 | Inaba et al. |
| 6,526,996 B1 | 3/2003 | Chang et al. |
| 6,534,807 B2 | 3/2003 | Mandelman et al. |
| 6,537,862 B2 | 3/2003 | Song |
| 6,537,885 B1 | 3/2003 | Kang et al. |
| 6,537,901 B2 | 3/2003 | Cha et al. |
| 6,541,829 B2 | 4/2003 | Nishinohara et al. |
| 6,555,879 B1 | 4/2003 | Krivokapic et al. |
| 6,562,665 B1 | 5/2003 | Yu |
| 6,562,687 B1 | 5/2003 | Deleonibus et al. |
| 6,566,734 B2 | 5/2003 | Sugihara et al. |
| 6,583,469 B1 | 6/2003 | Fried et al. |
| 6,605,498 B1 | 8/2003 | Murthy et al. |
| 6,607,948 B1 | 8/2003 | Sugiyama et al. |
| 6,610,576 B2 | 8/2003 | Nowak |
| 6,611,029 B1 | 8/2003 | Ahmed et al. |
| 6,630,388 B2 | 10/2003 | Sekigawa et al. |
| 6,635,909 B2 | 10/2003 | Clark et al. |
| 6,642,090 B1 | 11/2003 | Fried et al. |
| 6,642,114 B2 | 11/2003 | Nakamura |
| 6,645,797 B1 | 11/2003 | Buynoski et al. |
| 6,645,826 B2 | 11/2003 | Yamazaki et al. |
| 6,645,861 B2 | 11/2003 | Cabral et al. |
| 6,656,853 B2 | 12/2003 | Ito |
| 6,657,259 B2 | 12/2003 | Fried et al. |
| 6,660,598 B2 | 12/2003 | Hanafi et al. |
| 6,664,160 B2 | 12/2003 | Park et al. |
| 6,680,240 B1 | 1/2004 | Maszara |
| 6,686,231 B1 | 2/2004 | Ahmed et al. |
| 6,689,650 B2 | 2/2004 | Gambino et al. |
| 6,693,324 B2 | 2/2004 | Maegawa et al. |
| 6,696,366 B1 | 2/2004 | Morey et al. |
| 6,706,571 B1 | 3/2004 | Yu et al. |
| 6,709,982 B1 | 3/2004 | Buynoski et al. |
| 6,713,396 B2 | 3/2004 | Anthony |
| 6,716,684 B1 | 4/2004 | Krivokapic et al. |
| 6,716,686 B1 | 4/2004 | Buynoski et al. |
| 6,716,690 B1 | 4/2004 | Wang et al. |
| 6,730,964 B2 | 5/2004 | Horiuchi |
| 6,744,103 B2 | 6/2004 | Snyder |
| 6,756,657 B1 | 6/2004 | Zhang et al. |
| 6,762,469 B2 | 7/2004 | Mocuta et al. |
| 6,764,884 B1 | 7/2004 | Yu et al. |
| 6,765,303 B1 | 7/2004 | Krivokapic et al. |
| 6,770,516 B2 | 8/2004 | Wu et al. |
| 6,774,390 B2 | 8/2004 | Sugiyama et al. |
| 6,780,694 B2 | 8/2004 | Doris et al. |
| 6,784,071 B2 | 8/2004 | Chen et al. |
| 6,784,076 B2 | 8/2004 | Gonzalez et al. |
| 6,787,402 B1 | 9/2004 | Yu |
| 6,787,406 B1 | 9/2004 | Hill et al. |
| 6,787,439 B2 | 9/2004 | Ahmed et al. |
| 6,787,845 B2 | 9/2004 | Deleonibus |
| 6,787,854 B1 | 9/2004 | Yang et al. |
| 6,790,733 B1 | 9/2004 | Natzle et al. |
| 6,794,313 B1 | 9/2004 | Chang |
| 6,794,718 B2 | 9/2004 | Nowak et al. |
| 6,798,000 B2 | 9/2004 | Luyken et al. |
| 6,800,885 B1 | 10/2004 | An et al. |
| 6,800,910 B2 | 10/2004 | Lin et al. |
| 6,803,631 B2 | 10/2004 | Dakshina-Murthy et al. |

| Patent No. | Date | Inventor |
|---|---|---|
| 6,812,075 B2 | 11/2004 | Fried et al. |
| 6,812,111 B2 | 11/2004 | Cheong et al. |
| 6,815,277 B2 | 11/2004 | Fried et al. |
| 6,821,834 B2 | 11/2004 | Ando |
| 6,825,506 B2 | 11/2004 | Chau et al. |
| 6,830,998 B1 | 12/2004 | Pan et al. |
| 6,831,310 B1 | 12/2004 | Mathew et al. |
| 6,833,588 B2 | 12/2004 | Yu et al. |
| 6,835,614 B2 | 12/2004 | Hanafi et al. |
| 6,835,618 B1 | 12/2004 | Dakshina-Murthy et al. |
| 6,838,322 B2 | 1/2005 | Pham et al. |
| 6,844,238 B2 | 1/2005 | Yeo et al. |
| 6,849,556 B2 | 2/2005 | Takahashi |
| 6,849,884 B2 | 2/2005 | Clark et al. |
| 6,852,559 B2 | 2/2005 | Kwak et al. |
| 6,855,606 B2 | 2/2005 | Chen et al. |
| 6,855,990 B2 | 2/2005 | Yeo et al. |
| 6,858,478 B2 | 2/2005 | Chau et al. |
| 6,864,540 B1 | 3/2005 | Divakaruni et al. |
| 6,867,433 B2 | 3/2005 | Yeo et al. |
| 6,867,460 B1 | 3/2005 | Anderson et al. |
| 6,869,868 B2 | 3/2005 | Chiu et al. |
| 6,869,898 B2 | 3/2005 | Inaki et al. |
| 6,870,226 B2 | 3/2005 | Maeda et al. |
| 6,884,154 B2 | 4/2005 | Mizushima et al. |
| 6,885,055 B2 | 4/2005 | Lee |
| 6,890,811 B2 | 5/2005 | Hou et al. |
| 6,891,234 B1 | 5/2005 | Connelly et al. |
| 6,897,527 B2 | 5/2005 | Dakshina-Murthy et al. |
| 6,902,947 B2 | 6/2005 | Chinn et al. |
| 6,902,962 B2 | 6/2005 | Yeo et al. |
| 6,909,147 B2 | 6/2005 | Aller et al. |
| 6,909,151 B2 | 6/2005 | Hareland et al. |
| 6,919,238 B2 | 7/2005 | Bohr |
| 6,921,691 B1 | 7/2005 | Li et al. |
| 6,921,702 B2 | 7/2005 | Ahn et al. |
| 6,921,963 B2 | 7/2005 | Krivokapic et al. |
| 6,921,982 B2 | 7/2005 | Joshi et al. |
| 6,924,190 B2 | 8/2005 | Dennison |
| 6,955,961 B1 | 10/2005 | Chung |
| 6,960,517 B2 | 11/2005 | Rios et al. |
| 6,967,351 B2 | 11/2005 | Fried et al. |
| 6,969,878 B2 | 11/2005 | Coronel et al. |
| 6,970,373 B2 | 11/2005 | Datta et al. |
| 6,974,738 B2 | 12/2005 | Hareland et al. |
| 6,975,014 B1 | 12/2005 | Krivokapic et al. |
| 6,977,415 B2 | 12/2005 | Matsuo |
| 6,998,301 B1 | 2/2006 | Yu et al. |
| 6,998,318 B2 | 2/2006 | Park |
| 7,013,447 B2 | 3/2006 | Mathew et al. |
| 7,018,551 B2 | 3/2006 | Beintner et al. |
| 7,045,401 B2 | 5/2006 | Lee et al. |
| 7,045,407 B2 | 5/2006 | Keating et al. |
| 7,045,441 B2 | 5/2006 | Chang et al. |
| 7,056,794 B2 | 6/2006 | Ku et al. |
| 7,060,539 B2 | 6/2006 | Chidambarrao et al. |
| 7,061,055 B2 | 6/2006 | Sekigawa et al. |
| 7,071,064 B2 | 7/2006 | Doyle et al. |
| 7,074,623 B2 | 7/2006 | Lochtefeld et al. |
| 7,074,656 B2 | 7/2006 | Yeo et al. |
| 7,074,662 B2 | 7/2006 | Lee et al. |
| 7,084,018 B1 | 8/2006 | Ahmed et al. |
| 7,105,390 B2 | 9/2006 | Brask et al. |
| 7,105,891 B2 | 9/2006 | Visokay |
| 7,105,894 B2 | 9/2006 | Yeo et al. |
| 7,105,934 B2 | 9/2006 | Anderson et al. |
| 7,112,478 B2 | 9/2006 | Grupp et al. |
| 7,115,945 B2 | 10/2006 | Lee et al. |
| 7,119,402 B2 | 10/2006 | Kinoshita et al. |
| 7,122,463 B2 | 10/2006 | Ohuchi |
| 7,132,360 B2 | 11/2006 | Schaeffer et al. |
| 7,138,320 B2 | 11/2006 | Van Bentum et al. |
| 7,141,480 B2 | 11/2006 | Adam et al. |
| 7,141,856 B2 | 11/2006 | Lee et al. |
| 7,154,118 B2 | 12/2006 | Lindert et al. |
| 7,163,851 B2 | 1/2007 | Adadeer et al. |
| 7,163,898 B2 | 1/2007 | Mariani et al. |
| 7,172,943 B2 | 2/2007 | Yeo et al. |
| 7,183,137 B2 | 2/2007 | Lee et al. |
| 7,187,043 B2 | 3/2007 | Arai et al. |
| 7,214,991 B2 | 5/2007 | Yeo et al. |
| 7,235,822 B2 | 6/2007 | Li |
| 7,238,564 B2 | 7/2007 | Ko et al. |
| 7,241,653 B2 | 7/2007 | Hareland et al. |
| 7,247,547 B2 | 7/2007 | Zhu et al. |
| 7,247,578 B2 | 7/2007 | Brask |
| 7,250,367 B2 | 7/2007 | Vaartstra et al. |
| 7,250,645 B1 | 7/2007 | Wang et al. |
| 7,268,024 B2 | 9/2007 | Yeo et al. |
| 7,291,886 B2 | 11/2007 | Doris et al. |
| 7,297,600 B2 | 11/2007 | Oh et al. |
| 7,304,336 B2 | 12/2007 | Cheng et al. |
| 7,323,710 B2 | 1/2008 | Kim et al. |
| 7,329,913 B2 | 2/2008 | Brask et al. |
| 7,339,241 B2 | 3/2008 | Orlowski et al. |
| 7,348,284 B2 | 3/2008 | Doyle et al. |
| 7,348,642 B2 | 3/2008 | Nowak |
| 7,354,817 B2 | 4/2008 | Watanabe et al. |
| 7,358,121 B2 | 4/2008 | Chau et al. |
| 7,396,730 B2 | 7/2008 | Li |
| 7,452,778 B2 | 11/2008 | Chen et al. |
| 7,456,471 B2 | 11/2008 | Anderson et al. |
| 7,456,476 B2 | 11/2008 | Hareland et al. |
| 7,479,421 B2 | 1/2009 | Kavalieros et al. |
| 7,573,059 B2 | 8/2009 | Hudait et al. |
| 7,585,734 B2 | 9/2009 | Kang et al. |
| 7,612,416 B2 | 11/2009 | Takeuchi et al. |
| 7,655,989 B2 | 2/2010 | Zhu et al. |
| 7,701,018 B2 | 4/2010 | Yamagami et al. |
| 2001/0019886 A1 | 9/2001 | Bruce et al. |
| 2001/0026985 A1 | 10/2001 | Kim et al. |
| 2001/0040907 A1 | 11/2001 | Chakrabarti |
| 2002/0011612 A1 | 1/2002 | Hieda |
| 2002/0036290 A1 | 3/2002 | Inaba et al. |
| 2002/0037619 A1 | 3/2002 | Sugihara et al. |
| 2002/0048918 A1 | 4/2002 | Grider et al. |
| 2002/0058374 A1 | 5/2002 | Kim et al. |
| 2002/0074614 A1 | 6/2002 | Furuta et al. |
| 2002/0081794 A1 | 6/2002 | Ito |
| 2002/0096724 A1 | 7/2002 | Liang et al. |
| 2002/0142529 A1 | 10/2002 | Matsuda et al. |
| 2002/0149031 A1 | 10/2002 | Kim et al. |
| 2002/0160553 A1 | 10/2002 | Yamanaka et al. |
| 2002/0166838 A1 | 11/2002 | Nagarajan |
| 2002/0167007 A1 | 11/2002 | Yamazaki et al. |
| 2002/0177263 A1 | 11/2002 | Hanafi et al. |
| 2002/0177282 A1 | 11/2002 | Song |
| 2002/0185655 A1 | 12/2002 | Fahimulla et al. |
| 2003/0036290 A1 | 2/2003 | Hsieh et al. |
| 2003/0042542 A1 | 3/2003 | Maegawa et al. |
| 2003/0057477 A1 | 3/2003 | Hergenrother et al. |
| 2003/0057486 A1 | 3/2003 | Gambino et al. |
| 2003/0067017 A1 | 4/2003 | Ieong et al. |
| 2003/0080332 A1 | 5/2003 | Phillips |
| 2003/0085194 A1 | 5/2003 | Hopkins, Jr. |
| 2003/0098479 A1 | 5/2003 | Murthy et al. |
| 2003/0098488 A1 | 5/2003 | O'Keeffe et al. |
| 2003/0102497 A1 | 6/2003 | Fried et al. |
| 2003/0102518 A1 | 6/2003 | Fried et al. |
| 2003/0111686 A1 | 6/2003 | Nowak |
| 2003/0122186 A1 | 7/2003 | Sekigawa et al. |
| 2003/0143791 A1 | 7/2003 | Cheong et al. |
| 2003/0151077 A1 | 8/2003 | Mathew et al. |
| 2003/0174534 A1 | 9/2003 | Clark et al. |
| 2003/0190766 A1 | 10/2003 | Gonzalez et al. |
| 2003/0201458 A1 | 10/2003 | Clark et al. |
| 2003/0203636 A1 | 10/2003 | Hieda |
| 2003/0227036 A1 | 12/2003 | Sugiyama et al. |
| 2004/0016968 A1 | 1/2004 | Coronel et al. |
| 2004/0029345 A1 | 2/2004 | Deleonibus et al. |
| 2004/0029393 A1 | 2/2004 | Ying et al. |
| 2004/0031979 A1 | 2/2004 | Lochtefeld et al. |
| 2004/0033639 A1 | 2/2004 | Chinn et al. |
| 2004/0036118 A1 | 2/2004 | Abadeer et al. |
| 2004/0036126 A1 | 2/2004 | Chau et al. |
| 2004/0036127 A1 | 2/2004 | Chau et al. |
| 2004/0038436 A1 | 2/2004 | Mori et al. |
| 2004/0038533 A1 | 2/2004 | Liang |

| | | | | | | |
|---|---|---|---|---|---|---|
| 2004/0061178 A1 | 4/2004 | Lin et al. | | 2005/0184316 A1 | 8/2005 | Kim et al. |
| 2004/0063286 A1 | 4/2004 | Kim et al. | | 2005/0189583 A1 | 9/2005 | Kim et al. |
| 2004/0070020 A1 | 4/2004 | Fujiwara et al. | | 2005/0199919 A1 | 9/2005 | Liu et al. |
| 2004/0075149 A1 | 4/2004 | Fitzgerald et al. | | 2005/0202604 A1 | 9/2005 | Cheng et al. |
| 2004/0082125 A1 | 4/2004 | Hou | | 2005/0215014 A1 | 9/2005 | Ahn et al. |
| 2004/0092062 A1 | 5/2004 | Ahmed et al. | | 2005/0215022 A1 | 9/2005 | Adam et al. |
| 2004/0092067 A1 | 5/2004 | Hanafi et al. | | 2005/0224797 A1 | 10/2005 | Ko et al. |
| 2004/0094807 A1 | 5/2004 | Chau et al. | | 2005/0224800 A1 | 10/2005 | Lindert et al. |
| 2004/0099903 A1 | 5/2004 | Yeo et al. | | 2005/0227498 A1 | 10/2005 | Furukawa et al. |
| 2004/0099966 A1 | 5/2004 | Chau et al. | | 2005/0230763 A1 | 10/2005 | Huang et al. |
| 2004/0108523 A1 | 6/2004 | Chen et al. | | 2005/0233156 A1 | 10/2005 | Senzaki et al. |
| 2004/0108558 A1 | 6/2004 | Kwak et al. | | 2005/0239252 A1 | 10/2005 | Ahn et al. |
| 2004/0110097 A1 | 6/2004 | Ahmed et al. | | 2005/0255642 A1 | 11/2005 | Liu et al. |
| 2004/0110331 A1 | 6/2004 | Yeo et al. | | 2005/0266645 A1 | 12/2005 | Park |
| 2004/0113181 A1 | 6/2004 | Wicker | | 2005/0272192 A1 | 12/2005 | Oh et al. |
| 2004/0119100 A1 | 6/2004 | Nowak et al. | | 2005/0277294 A1 | 12/2005 | Schaefer et al. |
| 2004/0124492 A1 | 7/2004 | Matsuo | | 2005/0280121 A1 | 12/2005 | Doris et al. |
| 2004/0126975 A1 | 7/2004 | Ahmed et al. | | 2005/0287752 A1 | 12/2005 | Nouri et al. |
| 2004/0132236 A1 | 7/2004 | Doris et al. | | 2006/0014338 A1 | 1/2006 | Doris et al. |
| 2004/0145000 A1 | 7/2004 | An et al. | | 2006/0040054 A1 | 2/2006 | Pearlstein et al. |
| 2004/0145019 A1 | 7/2004 | Dakshina-Murthy et al. | | 2006/0043500 A1 | 3/2006 | Chen et al. |
| 2004/0166642 A1 | 8/2004 | Chen et al. | | 2006/0046521 A1 | 3/2006 | Vaartstra et al. |
| 2004/0169221 A1 | 9/2004 | Ko et al. | | 2006/0063469 A1 | 3/2006 | Talieh et al. |
| 2004/0169269 A1 | 9/2004 | Yeo et al. | | 2006/0068591 A1 | 3/2006 | Radosavljevic et al. |
| 2004/0180491 A1 | 9/2004 | Arai et al. | | 2006/0071299 A1 | 4/2006 | Doyle et al. |
| 2004/0191980 A1 | 9/2004 | Rios et al. | | 2006/0086977 A1 | 4/2006 | Shah et al. |
| 2004/0195624 A1 | 10/2004 | Liu et al. | | 2006/0148182 A1 | 7/2006 | Datta et al. |
| 2004/0198003 A1 | 10/2004 | Yeo et al. | | 2006/0154478 A1 | 7/2006 | Hsu et al. |
| 2004/0203254 A1 | 10/2004 | Conley et al. | | 2006/0170066 A1 | 8/2006 | Mathew et al. |
| 2004/0209463 A1 | 10/2004 | Kim et al. | | 2006/0172479 A1 | 8/2006 | Furukawa et al. |
| 2004/0217420 A1 | 11/2004 | Yeo et al. | | 2006/0172480 A1 | 8/2006 | Wang et al. |
| 2004/0219711 A1 | 11/2004 | Wu et al. | | 2006/0172497 A1 | 8/2006 | Hareland et al. |
| 2004/0219722 A1 | 11/2004 | Pham et al. | | 2006/0180859 A1 | 8/2006 | Radosavljevic et al. |
| 2004/0219780 A1 | 11/2004 | Ohuchi | | 2006/0202270 A1 | 9/2006 | Son et al. |
| 2004/0222473 A1 | 11/2004 | Risaki | | 2006/0204898 A1 | 9/2006 | Gutsche et al. |
| 2004/0227187 A1 | 11/2004 | Cheng et al. | | 2006/0205164 A1 | 9/2006 | Ko et al. |
| 2004/0238887 A1 | 12/2004 | Nihey | | 2006/0211184 A1 | 9/2006 | Boyd et al. |
| 2004/0238915 A1 | 12/2004 | Chen et al. | | 2006/0220131 A1 | 10/2006 | Kinoshita et al. |
| 2004/0256647 A1 | 12/2004 | Lee et al. | | 2006/0227595 A1 | 10/2006 | Chuang et al. |
| 2004/0262683 A1 | 12/2004 | Bohr et al. | | 2006/0240622 A1 | 10/2006 | Lee et al. |
| 2004/0262699 A1 | 12/2004 | Rios et al. | | 2006/0244066 A1 | 11/2006 | Yeo et al. |
| 2004/0266076 A1 | 12/2004 | Doris et al. | | 2006/0263699 A1 | 11/2006 | Abatchev et al. |
| 2005/0019993 A1 | 1/2005 | Lee et al. | | 2006/0281325 A1 | 12/2006 | Chou et al. |
| 2005/0020020 A1 | 1/2005 | Collaert et al. | | 2007/0001219 A1 | 1/2007 | Radosavljevic et al. |
| 2005/0023633 A1 | 2/2005 | Yeo et al. | | 2007/0023795 A1 | 2/2007 | Nagano et al. |
| 2005/0035415 A1 | 2/2005 | Yeo et al. | | 2007/0029624 A1 | 2/2007 | Nowak |
| 2005/0040429 A1 | 2/2005 | Uppal | | 2007/0045735 A1 | 3/2007 | Orlowski et al. |
| 2005/0040444 A1 | 2/2005 | Cohen | | 2007/0045748 A1 | 3/2007 | Booth, Jr. et al. |
| 2005/0059214 A1 | 3/2005 | Cheng et al. | | 2007/0048930 A1 | 3/2007 | Figura et al. |
| 2005/0062082 A1 | 3/2005 | Bucher et al. | | 2007/0052041 A1 | 3/2007 | Sorada et al. |
| 2005/0073060 A1 | 4/2005 | Datta et al. | | 2007/0069293 A1 | 3/2007 | Kavalieros et al. |
| 2005/0093028 A1 | 5/2005 | Chambers | | 2007/0069302 A1 | 3/2007 | Jin et al. |
| 2005/0093067 A1 | 5/2005 | Yeo et al. | | 2007/0090416 A1 | 4/2007 | Doyle et al. |
| 2005/0093075 A1 | 5/2005 | Bentum et al. | | 2007/0093010 A1 | 4/2007 | Mathew et al. |
| 2005/0093154 A1 | 5/2005 | Kottantharayil et al. | | 2007/0108514 A1 | 5/2007 | Inoue et al. |
| 2005/0104055 A1 | 5/2005 | Kwak et al. | | 2007/0187682 A1 | 8/2007 | Takeuchi et al. |
| 2005/0110082 A1 | 5/2005 | Cheng | | 2007/0241414 A1 | 10/2007 | Narihiro |
| 2005/0116218 A1* | 6/2005 | Yang ................................ 257/19 | | 2007/0259501 A1 | 11/2007 | Xiong et al. |
| 2005/0116289 A1 | 6/2005 | Boyd et al. | | 2007/0262389 A1 | 11/2007 | Chau et al. |
| 2005/0118790 A1 | 6/2005 | Lee et al. | | 2008/0017890 A1 | 1/2008 | Yuan et al. |
| 2005/0127362 A1 | 6/2005 | Zhang et al. | | 2008/0017934 A1 | 1/2008 | Kim et al. |
| 2005/0127632 A1 | 6/2005 | Gehret | | 2008/0111163 A1 | 5/2008 | Russ et al. |
| 2005/0133829 A1 | 6/2005 | Kunii et al. | | 2008/0116515 A1 | 5/2008 | Gossner et al. |
| 2005/0133866 A1 | 6/2005 | Chau et al. | | 2008/0128796 A1 | 6/2008 | Zhu et al. |
| 2005/0136584 A1 | 6/2005 | Boyanov et al. | | 2008/0128797 A1 | 6/2008 | Dyer et al. |
| 2005/0139860 A1 | 6/2005 | Snyder et al. | | 2008/0212392 A1 | 9/2008 | Bauer |
| 2005/0145894 A1 | 7/2005 | Chau et al. | | 2008/0237655 A1 | 10/2008 | Nakabayashi et al. |
| 2005/0145941 A1 | 7/2005 | Bedell et al. | | 2008/0258207 A1 | 10/2008 | Radosavljevic et al. |
| 2005/0145944 A1 | 7/2005 | Murthy et al. | | 2009/0061572 A1 | 3/2009 | Hareland et al. |
| 2005/0148131 A1 | 7/2005 | Brask | | 2009/0090976 A1 | 4/2009 | Kavalieros et al. |
| 2005/0148137 A1 | 7/2005 | Brask et al. | | 2009/0099181 A1 | 4/2009 | Wurster et al. |
| 2005/0153494 A1 | 7/2005 | Ku et al. | | 2010/0200923 A1 | 8/2010 | Chen et al. |
| 2005/0156171 A1 | 7/2005 | Brask et al. | | | | |
| 2005/0156202 A1 | 7/2005 | Rhee et al. | | FOREIGN PATENT DOCUMENTS | | |
| 2005/0156227 A1 | 7/2005 | Jeng | | EP | 0265314 | 4/1988 |
| 2005/0161739 A1 | 7/2005 | Anderson et al. | | EP | 0469604 | 2/1992 |
| 2005/0162928 A1 | 7/2005 | Rosmeulen | | EP | 0474952 | 3/1992 |
| 2005/0167766 A1 | 8/2005 | Yagishita | | EP | 0510667 | 10/1992 |
| 2005/0170593 A1 | 8/2005 | Kang et al. | | EP | 0623963 | 5/1994 |

| | | |
|---|---|---|
| EP | 1091413 | 4/2001 |
| EP | 1202335 | 5/2002 |
| EP | 1566844 | 8/2005 |
| GB | 2156149 | 10/1985 |
| JP | 56073454 | 6/1981 |
| JP | 59145538 | 8/1984 |
| JP | 2303048 | 12/1990 |
| JP | 05090252 | 4/1993 |
| JP | 6005856 | 1/1994 |
| JP | 06132521 | 5/1994 |
| JP | 6151387 | 5/1994 |
| JP | 6177089 A | 6/1994 |
| JP | 6224440 | 8/1994 |
| JP | 9162301 | 6/1997 |
| JP | 2000037842 | 2/2000 |
| JP | 2001189453 | 7/2001 |
| JP | 2001338987 | 12/2001 |
| JP | 2002298051 | 10/2002 |
| JP | 2003298051 | 10/2003 |
| JP | 2005085916 | 3/2005 |
| TW | 200414538 | 8/1992 |
| TW | 200518310 | 11/1992 |
| TW | 516232 | 1/2003 |
| TW | 561530 | 1/2003 |
| TW | 548799 | 8/2003 |
| TW | 200402872 | 2/2004 |
| TW | 200405408 | 4/2004 |
| TW | 200417034 | 9/2004 |
| TW | 200729407 | 8/2007 |
| TW | I321830 | 3/2010 |
| WO | WO-9106976 | 5/1991 |
| WO | WO-0243151 | 5/2002 |
| WO | WO-02095814 | 11/2002 |
| WO | WO-03003442 | 1/2003 |
| WO | WO-2004059726 | 7/2004 |
| WO | WO-2005036651 | 4/2005 |
| WO | WO-2007038575 | 4/2007 |
| WO | WO-2007064492 | 6/2007 |

OTHER PUBLICATIONS

Office Action from U.S. Appl. No. 11/292,399 mailed Apr. 21, 2008, 7 pgs.
International Written Opinion from PCT/US2006/044601 mailed on Jun. 3, 2008, 10 pgs.
Examination Report from EP 06837855.3-1235 mailed Oct. 24, 2008, 9 pgs.
Non-Final Office Action for U.S. Appl. No. 12/338,839, mailed Oct. 15, 2009, 14 pgs.
Office Action from U.S. Appl. No. 11/501,253 mailed May 14, 2008, 12 pgs.
Office Action from U.S. Appl. No. 11/501,253 mailed Dec. 12, 2008, 8 pgs.
Notice of Allowance from U.S. Appl. No. 11/501,253 mailed Apr. 7, 2009, 4 pgs.
Office Action from U.S. Appl. No. 11/305,452 mailed Apr. 18, 2008, 7 pgs.
Office Action from U.S. Appl. No. 11/305,452 mailed Feb. 9, 2009, 8 pgs.
Final Office Action from U.S. Appl. No. 11/305,452 mailed Nov. 13, 2009, 8 pgs.
Office Action from U.S. Appl. No. 11/305,452 mailed Aug. 4, 2010, 7 pgs.
Final Office Action from U.S. Appl. No. 11/305,452 mailed Jan. 21, 2011, 15 pgs.
Office Action from U.S. Appl. No. 11/498,901 mailed Aug. 1, 2008, 13 pgs.
Final Office Action from U.S. Appl. No. 11/498,901 mailed Nov. 17, 2008, 17 pgs.
Office Action from U.S. Appl. No. 11/498,901 mailed Jun. 8, 2009, 9 pgs.
Final Office Action from U.S. Appl. No. 11/498,901 mailed Dec. 17, 2009, 10 pgs.
Office Action from U.S. Appl. No. 11/498,901 mailed Mar. 26, 2010, 14 pgs.
Final Office Action from U.S. Appl. No. 11/498,901 mailed Sep. 1, 2010, 16 pgs.
Final Office Action from U.S. Appl. No. 12/338,839 mailed Apr. 19, 2010, 10 pgs.
Office Action from U.S. Appl. No. 12/338,839 mailed Dec. 1, 2010, 12 pgs.
Office Action from U.S. Appl. No. 11/238,445 mailed Oct. 20, 2006, 22 pgs.
Final Office Action from U.S. Appl. No. 11/238,445 mailed May 14, 2007, 16 pgs.
Office Action from Taiwanese Patent Application No. 095143047, mailed Mar. 18, 2010, 7 pgs.
First Office Action from Chinese Application No. 2006800444311, mailed Nov. 25, 2009, 15 pgs.
Second Office Action from Chinese Patent Application No. 200680044431.1, mailed Apr. 30, 2010, 3 pgs.
Invitation to Pay Additional Fees from PCT/US2004/032442 mailed on Apr. 12, 2005, 5 pgs.
International Search Report and Written Opinion from PCT/US2004/032442 mailed Jun. 16, 2005, 22 pgs.
International Search Report & Written Opinion from PCT/US2006/000378 mailed on May 24, 2006, 11 pgs.
International Search Report & Written Opinion from PCT/US2005/000947 mailed on May 3, 2005, 14 pgs.
International Search Report and Written Opinion from PCT/US2005/010505 mailed on Aug. 26, 2005, 24 pgs.
International Search Report and Written Opinion from PCT/US2005/020339 mailed on Oct. 4, 2005, 12 pgs.
Office Action from U.S. Appl. No. 10/227,068 mailed Dec. 18, 2006, 25 pgs.
Office Action from U.S. Appl. No. 10/703,316 mailed Dec. 15, 2006, 22 pgs.
International Search Report & Written Opinion from PCT/US2006/025751 mailed on Dec. 6, 2006, 14 pgs.
International Search Report & Written Opinion from PCT/US2005/035380 mailed on Feb. 13, 2006, 14 pgs.
International Search Report & Written Opinion from PCT/US2005/033439 mailed on Jan. 31, 2006, 7 pgs.
International Search Report & Written Opinion from PCT/US2005/037169 mailed on Feb. 23, 2006, 11 pgs.
International Search Report & Written Opinion from PCT/US2006/037643 mailed on Jan. 24, 2007, 14 pgs.
First Office Action from U.S. Appl. No. 11/158,661 mailed Jan. 15, 2008, 25 pgs.
Office Action from U.S. Appl. No. 11/080,765 mailed May 2, 2007, 47 pgs.
Final Office Action from U.S. Appl. No. 11/080,765 mailed Nov. 13, 2007, 13 pgs.
International Preliminary Report on Patentability from PCT/US/2006/037634, mailed Apr. 10, 2008, 12 pgs.
Office Action from PRC Application No. 200580007279.5, PCT/US05/ 000947, mailed Apr. 4, 2008, 2 pgs.
Written Opinion from Singapore Patent Application No. 200604766-6 mailed Apr. 4, 2008, 4 pgs.
Office Action from Taiwan Patent Application No. 95122087 mailed Jun. 20, 2008, 8 pgs.
IPO Search Report for Application No. 094136197, date mailed Sep. 19, 2008, 1 pg.
Office Action for European Patent Application No. 06815547.2, mailed Sep. 9, 2008, 3 pgs.
Office Action from European Patent Application No. 03817699.6 mailed Aug. 29, 2007, 3 pgs.
Written Opinion from Patent Application No. 2005070131 mailed Mar. 18, 2007, 4 pgs.
International Preliminary Report on Patentability from Application No. PCT/US2006/024516 mailed Jan. 10, 2008, 11 pgs.
Office Action from Taiwan Patent Application No. 95123858, dated Oct. 9, 2008, 10 pgs.
Office Action from U.S. Appl. No. 12/025,665 mailed on Nov. 12, 2008, 21 pgs.
International Search Report PCT/US2003/40320 mailed Jun. 2, 2004, 6 pgs.

Office Action from U.S. Appl. No. 11/855,823, mailed Dec. 30, 2008, 18 pgs.
Office Action from Taiwan Patent Application No. 95135820 mailed on Jan. 9, 2009, 14 pgs.
Office Action from Taiwan Patent Application No. 95123858—translation, mailed Mar. 3, 2009, 10 pgs.
Office Action from U.S. Appl. No. 11/240,487 mailed Mar. 17, 2009, 13 pgs.
Office Action from U.S. Appl. No. 11/322,795 mailed Mar. 4, 2009, 12 pgs.
Office Action from Taiwan Patent Application No. 95122087 mailed Dec. 16, 2008, 14 pgs.
German Office Action for German Patent Application No. 11 2006 003 576.2-33 mailed Dec. 12, 2008, 3 pgs.
Office Action from U.S. Appl. No. 11/154,138 mailed Jun. 23, 2009, 14 pgs.
Office Action from Taiwan Patent Application No. 95135820 mailed Jun. 4, 2009, 18 pgs.
Second Office Action from Chinese Patent Application No. 200580032314.9 mailed May 8, 2009, 14 pgs.
Final Office Action from U.S. Appl. No. 12/025,665 mailed Jun. 10, 2009, 10 pgs.
Office Action from U.S. Appl. No. 11/088,035 mailed Aug. 29, 2007, 3 pgs.
Non-Final Office Action for U.S. Appl. No. 11/855,823, mailed Jul. 23, 2009, 31 pages.
Non-Final Office Action from U.S. Appl. No. 11/322,795 mailed Jul. 28, 2009, 18 pgs.
Non-Final Office Action from U.S. Appl. No. 11/064,996 mailed Sep. 4, 2007, 16 pgs.
Non-Final Office Action from U.S. Appl. No. 11/320,467 mailed Sep. 10, 2007, 18 pgs.
Non-Final Office Action from U.S. Appl. No. 11/097,429 mailed Sep. 10, 2007, 17 pgs.
Non-Final Office Action from U.S. Appl. No. 11/158,661 mailed Sep. 17, 2007, 42 pgs.
Non-Final Office Action from U.S. Appl. No. 11/238,447 mailed Sep. 27, 2007, 9 pgs.
Non-Final Office Action from U.S. Appl. No. 11/335,103 mailed Oct. 31, 2007, 12 pgs.
Non-Final Office Action from U.S. Appl. No. 11/322,795 mailed Jan. 2, 2008, 10 pgs.
Non-Final Office Action from U.S. Appl. No. 11/332,189 mailed Jan. 11, 2008, 5 pgs.
Non-Final Office Action from U.S. Appl. No. 10/607,769 mailed Jan. 7, 2008, 17 pgs.
European Patent Office Action from EP Patent Application No. 03788707.2-1528 mailed Jul. 26, 2007, 4 pgs.
United Kingdom Examination Report from UK Patent Application No. GB0714637.6 mailed Sep. 10, 2007, 2 pgs.
Office Action from Chinese Patent Application No. 200680023301.X mailed Jun. 26, 2009, whole document.
Final Office Action from U.S. Appl. No. 11/240,487 mailed Sep. 21, 2009, 22 pgs.
Final Office Action from U.S. Appl. No. 11/240,487 mailed Jul. 7, 2010, 10 pgs.
Non-Final Office Action for U.S. Appl. No. 12/259,464, mailed Oct. 20, 2009, 41 pgs.
Notice of Preliminary Rejection mailed Sep. 14, 2009 for Korean Application No. 10-2007-7030988 incl. translation, mailed Sep. 14, 2009, 4 pgs.
Final Office Action for U.S. Appl. No. 11/322,795 mailed Jan. 13, 2010, 12 pgs.
International Search Report & Written Opinion from PCT/US2006/024516 mailed on Jan. 10, 2007, 18 pgs.
International Search Report & Written Opinion from PCT/US2006/037634 mailed on May 31, 2007, 21 pgs.
Office Action for EP Application No. 05711376.3 mailed Jan. 11, 2010, 5 pgs.
Office Action for German Application No. 112006001735.7 with translation mailed Oct. 20, 2009, 6 pgs.
Office Action for U.S. Appl. No. 11/648,521 mailed Aug. 5, 2009, 13 pgs.
Final Office Action for U.S. Appl. No. 11/648,521 mailed Jan. 8, 2010, 12 pgs.
Office Action from Taiwan Patent Application No. 95135820 mailed Oct. 22, 2009, 5 pgs.
Non-final Office Action for U.S. Appl. No. 11/855,823 mailed Mar. 15, 2010 mailed Mar. 15, 2010, 31 pgs.
Final Office Action for U.S. Appl. No. 11/828,290, mailed Feb. 17, 2010, 14 pgs.
Non-Final Office Action for Korean Patent Application No. 10-2007-7030988 mailed Mar. 12, 2010, 3 pgs.
Final Office Action for U.S. Appl. No. 11/648,521 mailed Apr. 27, 2010, 18 pgs.
Non-Final Office Action for U.S. Appl. No. 11/335,103 mailed Nov. 13, 2009, 17 pgs.
Final Office Action for U.S. Appl. No. 11/335,103 mailed May 26, 2010, 14 pgs.
Non-Final Office Action for U.S. Appl. No. 10/973,228 mailed Feb. 2, 2010, 22 pages.
Final Office Action for U.S. Appl. No. 10/973,228 mailed Aug. 24, 2010, 10 pages.
Notice of Allowance and Fees for U.S. Appl. No. 11/855,823 mailed Sep. 2, 2010, 33 pgs.
Final Office Action for U.S. Appl. No. 12/333,248 mailed Jun. 22, 2010, 16 pgs.
Office Action for U.S. Appl. No. 12/333,248 mailed Nov. 30, 2009, 14 pgs.
Office Action for Taiwanese Patent Application No. 95134963 mailed Jun. 1, 2009, 4 pgs.
Notice of Allowance for U.S. Appl. No. 11/154,138 mailed Aug. 13, 2010, 10 pgs.
Office Action for Chinese Patent Application No. 200680021817.0 mailed Jun. 12, 2009, 11 pgs.
Office Action for U.S. Appl. No. 11/332,189 mailed Jul. 8, 2010, 12 pgs.
Office Action for Chinese Patent Application No. 200580009823.X mailed Jun. 21, 2010, 5 pgs.
Office Action for United Kingdom Patent Application No. 0724762.0 mailed Aug. 2, 2010, 1 pg.
Office Action for Korean Patent Application No. 10-2007-7030988 mailed Aug. 10, 2010, 17 pgs.
Office Action for Korean Application No. 10-2008-7007431 mailed on Dec. 30, 2010, 5 pgs.
Office Action for U.S. Appl. No. 11/648,521 mailed Jan. 4, 2011, 14 pgs.
Non-Final Office Action for U.S. Appl. No. 11/240,440 mailed May 12, 2010, 8 pgs.
Office Action from U.S. Appl. No. 12/893,753 mailed Jan. 21, 2011, 27 pgs.
International Preliminary Report on Patentability from PCT/US2005/010505 mailed on Oct. 12, 2006, 16 pgs.
International Search Report & Written Opinion from PCT/US2004/032442 mailed on Jun. 16, 2005, 12 pgs.
Office Action from U.S. Appl. No. 11/234,014 mailed Jan. 23, 2008, 9 pgs.
Non-Final Office Action for European Application No. 03817697.0 mailed Mar. 9, 2010, 5 pgs.
Office Action from U.S. Appl. No. 11/234,014 mailed Jun. 13, 2007, 8 pgs.
Non-Final Office Action for U.S. Appl. No. 12/114,227 mailed Mar. 30, 2010, 30 pgs.
Office Action from Japanese Application No. 2006-549560 mailed Apr. 13, 2010, 8 pgs.
Non-Final Office Action for U.S. Appl. No. 11/240,440 mailed May 15, 2010, 8 pgs.
Final Office Action for U.S. Appl. No. 11/154,138 mailed Dec. 8, 2009, 13 pgs.
Non-Final Office Action for U.S. Appl. No. 11/240,487 mailed Dec. 11, 2009, 11 pgs.
Second Office Action for Chinese Application No. 200680021817.0 mailed Dec. 11, 2009, 11 pgs.
Third Office Action for Chinese Application No. 200580032314.9 mailed Jan. 29, 2010, 21 pgs.

Non-Final Office Action for U.S. Appl. No. 12/369,642 mailed Apr. 27, 2010, 15 pgs.

Non-Final Office Action for U.S. Appl. No. 11/360,269 mailed Aug. 22, 2007, 12 pgs.

Ashley, T. et al., High-Speed, Low-Power InSb Transistors, IEDM 97, 4 pgs.

Ashley et al., InSb-based Quantum Well Transistors for High Speed, Low Power Applications, QinetiQ, Malvern Technology Center and Intel 2004, 4 pgs.

Auth, Christopher P., et al., Vertical, Fully-Depleted, Surrounding Gate MOSFETs on sub-0.1 um Thick Silicon Pillars, 54th Annual Device Research Conference Digest, 1996, 2 pgs.

Balakrishnan, G. et al., Room-Temperature Optically-Pumped InGaSb Quantum Well Lasers Monolithically Grown on Si (100) Substrate, IEEE Feb. 12, 2005, 2 pgs.

Bednyi, et al., Electronic State of the Surface of INP Modified by Treatment in Sulfur Vapor, Soviet Physics Semiconductors, Am. Inst. of Physics, New York, vol. 26, No. 8, Aug. 1, 1992, 18 pgs.

Bessolov, V N. et al., Chalcogenide passivation of III-V semiconductor surfaces, Semiconductores, vol. 32, Nov. 1998, 16 pgs.

Buchanan, D. A., et al., Fabrication of Midgap Metal Gates Compatible With Ultrathin Dielectrics, Applied Physics Letters, vol. 73.12, Sep. 21, 1998, 3 pgs.

Burenkov, A., et al., Corner Effect in Double and Triple Gate FinFETs, European Solid-State Device Research 2003, 33rd Conference on ESSDERC, 4pgs.

Chang, L., et al., CMOS Circuit Performance Enhancement by Surface Orientation Optimization, IEEE Transactions on Electron Devices, vol. 51, No. 10, Oct. 2004, 7 pgs.

Chang, S. T., et al., 3-D Simulation of Strained Si/SiGe Heterojunction FinFets, Semiconductor Device Research Symposium, Dec. 2003, 2 pgs.

Chau, Robert, Advanced Metal Gate/High-K Dielectric Stacks for High-Performance CMOS Transistors, Components Research, Intel Corporation, 2004, 3 pgs.

Chau, Robert, et al., Advanced Depleted-Subtrate Transistors: Single-Gate, Double-Gate and Tri-Gate (Invited Paper), Components Research, Logic Technology Development, Intel Corporation, Hillsboro OR, 2 pgs.

Choi, Yang-Kyu, et al., A Spacer Patterning Technology for Nanoscale CMOS, IEEE, (49)3, XP-001102694, Mar. 2002, 6 pgs.

Choi, Yang-Kyu, et al., Sub-20nm CMOS FinFET Technologies, IEEE, IEDM, 2001, 4 pgs.

Claflin, B., et al., Interface Studies of Tungsten Nitride and Titanium Nitride Composite Metal Gate Electrodes With Thin Dielectric Layers, Journal of Vacuum Science and Technology A 16.3, May/Jun. 1998, 5 pgs.

Collaert, N., et al., A Functional 41-stage ring oscillator using scaled FinFET devices with 25-nm gate lengths and 10-nm fin widths applicable for the 45-nm CMOS node, IEEE Electron Device Letters, vol. 25, No. 8, Aug. 2004, 3 pgs.

Datta et al., 85nm Gate Length Enhancement and Depletion Mode InSb Quantum Well Transistors for Ultra High Speed and Very Low Power Digital Logic Applications, IEEE Dec. 5, 2005, 4 pgs.

Frank et al, HfO2 and Al2O3 Gate Dielectrics on GaAs Grown by Atomic Layer Deposition, Appl. Phys. Lett., vol. 86, No. 15, 2005, 3 pgs.

Fried, David M., et al., Improved Independent Gate N-Type FinFET Fabrication and Characterization, IEEE 24(9), Sep. 2003, 3 pgs.

Fried, David M., et al., High-Performance P-Type Independent-Gate FinFETs, IEEE 25(4), 2004, 3 pgs.

Gonzalez, C. et al., Selenium passivation of GaAs(001): a combined experimental and theoretical study, 2004 J. Phys. Condens. Matter 16 2187, 21 pgs.

Guo, Jing, et al., Performance Projections for Ballistic Carbon Nanotube Field-Effect Transistors, Applied Physics Letters 80(17), Apr. 29, 2002, 3 pgs.

Hisamoto, Digh, et al., A Fully Depleted Lean-Channel Transistor (DELTA)-A Novel Vertical Ultrathin SOI MOSFET, IEEE Electron Device Letters, V. 11 (1), Jan. 1990, 4 pgs.

Hisamoto, Digh, et al., A Folded-Channel MOSFET for Deepsub-tenth Micron Era, 1998 IEEE International Electron Device Meeting Technical Digest, 3 pgs.

Hisamoto, Digh, et al., FinFET-A Self-Aligned Double-Gate MOSFET Scalable to 20 nm, IEEE Transactions on Electron Devices, vol. 47, No. 12, Dec. 2000, 6 pgs.

Huang, Xuejue, et al., "Sub 50 nm FinFET: PMOS", 1999 IEEE International Electron Device Meeting Technical Digest, (1999), pp. 67-70.

Hwang, Jeong-Mo, et al., Novel Polysilicon/Tin Stacked-Gate Structure for Fully-Depleted SOI/CMOS, International Electronic Devices Meeting Technical Digest, 1992, 4 pgs.

Ieong, M., et al., Three Dimensional CMOS Devices and Integrated Circuits, IEEE CICC, San Jose, CA Sep. 21-24, 2003, 8 pgs.

Jang, H.W. et al., Incorporation of Oxygen Donors in AIGaN, J. Electrochem Soc 152, 2004, 5 pgs.

Javey, Ali, et al., High-k dielectrics for advanced carbon-nanotube transistors and logic gates, www.nature.com/naturematerials.com, 2002, 6 pgs.

Javey, Ali, et al., Ballistic carbon nanotube field-effect transistors, Nature, vol. 424, Aug. 7, 2003, 4 pgs.

Jin, B., Mobility Enhancement in Compressively Strained Sige Surface Channel PMOS Transistors with HFO2/TIN Gate Stack, Components Research, Intel Corporation, Oct. 2004, 12 pgs.

Jones, E. C., et al., Doping Challenges in Exploratory Devices for High Performance Logic, 14th Int'l Conference, Piscataway, NJ, Sep. 22-27, 2002, 6 pgs.

Kim, Sung M., et al., A Novel Multi-channel Field Effect Transistor (McFET) on Bulk Si for High Performance Sub-80nm Application, IEEE, 2004, 4 pgs.

Kuo, Charles, et al., A Capacitorless Double-Gate DRAM Cell Design for High Density Applications, IEEE, 2002, 4 pgs.

Kuo, Charles, et al., "A Capacitorless Double Gate DRAM Technology for Sub-100-nm Embedded and Stand-Alone Memory Applications", IEEE 50(12):, (2003), 2408-2416.

Ludwig, et al., FinFET Technology for Future Microprocessors, IEEE Int'l. SOI Conference, New Port Beach, CA, Sep. 29-Oct. 2, 2003, 2 pgs.

Martel, Richard, et al., "Carbon Nanotube Field Effect Transistors for Logic Applications", IEEE 2001, 4 pgs.

Mayer, T. M., et al., "Chemical Vapor Deposition of Flouroalkylsilane Monolayer Films for Adhesion Control in Microelectromechanical Systems", J. Vac. Sci. Technol. B. 18(5), 2000, 8 pgs.

Mistele, D. et al., Incorporation of Dielectric Layers into the Porcessing of III-Nitride-Based Heterosructure Field-Effect Transistors, Journal of Electronic Materials, vol. 32, No. 5, 2003, 9 pgs.

Mori, M. et al., Heteroepitaxial Growth of InSb on a Si (0 0 1) Substrate Via AlSb Buffer Layer, Applied Surface Science 216, 2003, 6 pgs.

Nackaerts, et al., "A 0.314um2 6T-SRAM Cell build with Tall Triple-Gate Devices for 45nm node applications using 0.75NA 193nm lithography", IEEE, 2004, 4 pgs.

Nowak, E. J., et al., "A Functional FinFET-DGCMOS SRAM Cell", Int'l. Electron Devices Meeting, San Francisco, CA Dec. 8-11, 2002, 4 pgs.

Nowak, E. J., et al., "Scaling Beyond the 65 nm Node with FinFET-DGCMOS", IEEE CICC, San Jose, CA Sep. 21-24, 2003, 4 pgs.

Nowak, Edward J., et al., "Turning Silicon on Its Edge", IEEE Circuits & Devices Magazine vol. 1, Jan./Feb. 2004, 12 pgs.

Ohsawa, Takashi, et al., "Memory Design Using a One-Transistor Gain Cell on SOI", IEEE 37(11), Nov. 2002, 13 pgs.

Park, Donggun, et al., 3-Dimensional Nano-CMOS Transistors to Overcome Scaling Limits, IEEE 2004, ISBN 0-7803-8511-X, 6 pgs.

Park, Jae-Hyoun, et al., Quantum-Wired MOSFET Photodetector Fabricated by Conventional Photolighography on SOI Substrate, Nanotechnology, 4th IEEE Conference on Munich, Germany, Aug. 16-19, 2004, Piscataway, NJ, 3 pgs.

Park, K.Y. et al., Device Characteristics of AlGaN/GaN MIS-HFET Using A/203-HfO3 Laminated High-k Dielectric, Japan Journal of Appl.Phys. vol. 43, 2004, 3 pgs.

Park, T., et al., "Fabrication of Body-Tied FinFETs (Omega MOSFETS) Using Bulk Si Wafers", 2003 Symposia on VLSI Technology Digest of Technical Papers, (Jun. 2003), pp. 135-136.

Park, Jong-Tae, et al., Pi-Gate SOI MOSFET, IEEE Electron Device Letters, vol. 22, No. 8, Aug. 2001, 2 pgs.

Park, T., et al., PMOS Body-Tied FinFET (Omega MOSFET) Characteristics, IEEE Device Research Conference, Piscataway, NJ, Jun. 23-25, 2003, 2 pgs.

Passlack, Matthias et al., Self-Aligned GaAs p-Channel Enhancement Mode MOS Heterostructure Field-Effefct Transistor, IEEE Electron Device Letters, vol. 23, No. 9, Sep. 2002, 3 pgs.

Scholz, S. et al., MOVPE growth of GaAs on Ge substrates by inserting a thin low temperature buffer layer, Cryst. Res. Technol. 41, No. 2, Jan. 15, 2006), 6 pgs.

Seevinck, Evert, et al., Static-Noise Margin Analysis of MOS SRAM Cells, IEEE, Journal of Solid-State Circuits, (SC-22)5, Oct. 1987, 7 pgs.

Sieg, R. M., et al., Toward device-quality GaAs growth by molecular beam epitaxy on offcut Ge/Si_Ge/Si substrates, J. Vac. Sci. Technol. B, vol. 16, No. 3, May/Jun. 1998. 4 pgs.

Stadele, M., et al., A Comprehensive Study of Corner Effects in Tri-gate Transistors, IEEE 2004, 4 pgs.

Stolk, Peter A., et al., Device Modeling Statistical Dopant Fluctuations in MOS Transistors, IEEE Transactions on Electron Devices, (45)9, 1997, 4 pgs.

Subramanian, V., "A Bulk-Si-Compatible Ultrathin-body SOI Technology for Sub-100m MOSFETS", Proceeding of the 57th Annual Device Research Conference, (1999), pp. 28-29.

Sugizaki, T., et al., Novel Multi-bit SONOS Type Flash Memory Using a High-k Charge Trapping Layer, VLSI Technology, 2003. Digest of Technical Papers. Symposium on Jun. 10-12, 2003, 2 pgs.

Tanaka, T., et al., Scalability Study on a Capacitorless IT-DRAM: From Single-gate PD-SOI to Double-gate FinDRAM, IEEE, 2004, 4 pgs.

Tang, Stephen H., et al., FinFET—A Quasi-Planar Double-Gate MOSFET, IEEE International Solid-State Circuits Conference, Feb. 6, 2001, 3 pgs.

Tokoro, Kenji, et al., Anisotropic Etching Properties of Silicon in KOH and TMAH Solutions, International Symposium on Micromechatronics and Human Science, IEEE, 1998, 6 pgs.

Wan, A. et al., Characterization of GaAs grown by molecular beam epitaxy on vicinal Ge (100) substrates, J. Vac. Sci. Technol. B, vol. 22, No. 4, Jul. 27, 2004, 6 pgs.

Wang, X., et al., "Band alignments in sidewall strained Si/strained SiGe heterostructures", (May 28, 2002), 1-5.

Wolf, Stanley, et al., Silicon Processing for the VLSI Era, vol. 1: Process Technology, Lattice Press, Sep. 1986, 3 pgs.

Xiong, W., et al., Corner Effect in Multiple-Gate SOI MOSFETs, IEEE, 2003, 3 pgs.

Xiong, Weize, et al., Improvement of FinFET Electrical Characteristics by Hydrogen Annealing, IEEE Electron Device Letters, 25(8), Aug. 2004, 3 pgs.

Yang, Fu-Liang, et al., 5nm-Gate Nanowire FinFET, IEEE, 2004, 2 pgs.

* cited by examiner

US 8,294,180 B2

CMOS DEVICES WITH A SINGLE WORK FUNCTION GATE ELECTRODE AND METHOD OF FABRICATION

CROSS-REFERENCE TO RELATED APPLICATIONS

This continuation application is related to, and claims priority to, the utility application entitled "CMOS DEVICES WITH A SINGLE WORK FUNCTION GATE ELECTRODE AND METHOD OF FABRICATION," filed on Sep. 28, 2005 now abandoned having an application Ser. No. of 11/238,447; and divisional application entitled "CMOS DEVICES WITH A SINGLE WORK GATE ELECTRODE AND METHOD OF FABRICATION," filed on Jan. 3, 2007, now U.S. Pat. No. 7,902,014 having an application Ser. No. of 11/649,545.

BACKGROUND

1. Field

The present invention relates to the field of semiconductor integrated circuit manufacturing, and more particularly to CMOS (complementary metal oxide semiconductor) devices having gate electrodes with a single work function.

2. Discussion of Related Art

During the past two decades, the physical dimensions of MOSFETs have been aggressively scaled for low-power, high-performance CMOS applications. In order to continue scaling future generations of CMOS, the use of metal gate electrode technology is important. For example, further gate insulator scaling will require the use of dielectric materials with a higher dielectric constant than silicon dioxide. Devices utilizing such gate insulator materials demonstrate vastly better performance when paired with metal gate electrodes rather than traditional poly-silicon gate electrodes.

Depending on the design of the transistors used in the CMOS process, the constraints placed on the metal gate material are somewhat different. For a planar, bulk or partially depleted, single-gate transistor, short-channel effects (SCE) are typically controlled through channel dopant engineering. Requirements on the transistor threshold voltages then dictate the gate work-function values must be close to the conduction and valence bands of silicon. For such devices, a "mid-gap" work function gate electrode that is located in the middle of the p and n channel work function range is inadequate. A mid-gap gate electrode typically results in a transistor having either a threshold voltage that is too high for high-performance applications, or a compromised SCE when the effective channel doping is reduced to lower the threshold voltage. For non-planar or multi-gate transistor designs, the device geometry better controls SCE and the channel may then be more lightly doped and potentially fully depleted at zero gate bias. For such devices, the threshold voltage can be determined primarily by the gate metal work function. However, even with the multi-gate transistor's improved SCE, it is typically necessary to have a gate electrode work function about 250 mV above mid-gap for an nMOS transistor and about 250 mV below mid-gap for a pMOS transistor. Therefore, a single mid-gap gate material is also incapable of achieving low threshold voltages for both pMOS (a MOSFET with a p-channel) and nMOS (a MOSFET with an n-channel) multi-gate transistors.

For these reasons, CMOS devices generally utilize two different gate electrodes, an nMOS electrode and a pMOS electrode, having two different work function values. For the traditional polysilicon gate electrode, the work function values are typically about 4.2 and 5.2 electron volts for the nMOS and pMOS electrodes respectively, and they are generally formed by doping the polysilicon material to be either n or p type. Attempts at changing the work function of metal gate materials to achieve similar threshold voltages is difficult as the metal work function must either be varied with an alloy mixture or two different metals utilized for n and p-channel devices.

One such conventional CMOS device 100 is shown in FIG. 1, where insulating substrate 102, having a carrier 101 and an insulator 103, has a pMOS transistor region 104 and an nMOS transistor region 105. The pMOS device in region 104 is comprised of a non-planar semiconductor body 106 having a source 116 and a drain 117, a gate insulator 112 and a gate electrode 113 made of a "p-metal" (a metal having a work function appropriate for a low pMOS transistor threshold voltage). The nMOS device in region 105 is comprised of a non-planar semiconductor body 107 having a source 116 and a drain 117, a gate insulator 112 and a gate electrode 114 made of an "n-metal" (a metal having a work function appropriate for a low nMOS transistor threshold voltage). While fabricating transistors having gate electrodes made of two different materials is prohibitively expensive, simpler approaches to dual-metal gate integration like work-function engineering of molybdenum, nickel and titanium through nitrogen implantation or silicidation suffer from problems such as poor reliability and insufficient work-function shift. However, as previously described, if a single mid-gap metal is used as the gate electrode for both the pMOS and nMOS transistors, the transistors have not had the low threshold voltage required for advanced CMOS.

BRIEF DESCRIPTION OF THE DRAWINGS

Embodiments

DETAILED DESCRIPTION

A novel device structure and its method of fabrication are described. In the following description, numerous specific details are set forth, such as specific materials, dimensions and processes, etc. in order to provide a thorough understanding of the present invention. In other instances, well-known semiconductor processes and manufacturing techniques have not been described in particular detail in order to not unnecessarily obscure the present invention.

Embodiments of the present invention include complementary (pMOS and nMOS) transistors having semiconductor channel regions which have been band gap engineered to achieve a low threshold voltage. In particular embodiments, the complementary devices utilize the same material having a single work function as the gate electrode. Engineering the band gap of the semiconductor transistor channels rather than engineering the work function of the transistor gate metal for the individual pMOS and nMOS devices avoids the manufacturing difficulties associated with depositing and interconnecting two separate gate metals in a dual-metal gate process. A single metal gate stack, used for both pMOS and nMOS transistors, simplifies fabrication while engineering the band gap of the semiconductor transistor channels enables independent tuning of the pMOS and nMOS threshold voltages. In embodiments of the present invention, the threshold voltage of a device can be targeted through the use of semiconductor materials that have an appropriate valance band (pMOS) or conduction band (nMOS) offset relative to the complementary device. Therefore, embodiments of the present invention can utilize a single mid-band gap metal for both the pMOS and nMOS transistors in a CMOS device while still achieving a low threshold voltage for both the pMOS and nMOS transistors.

Figure 1:
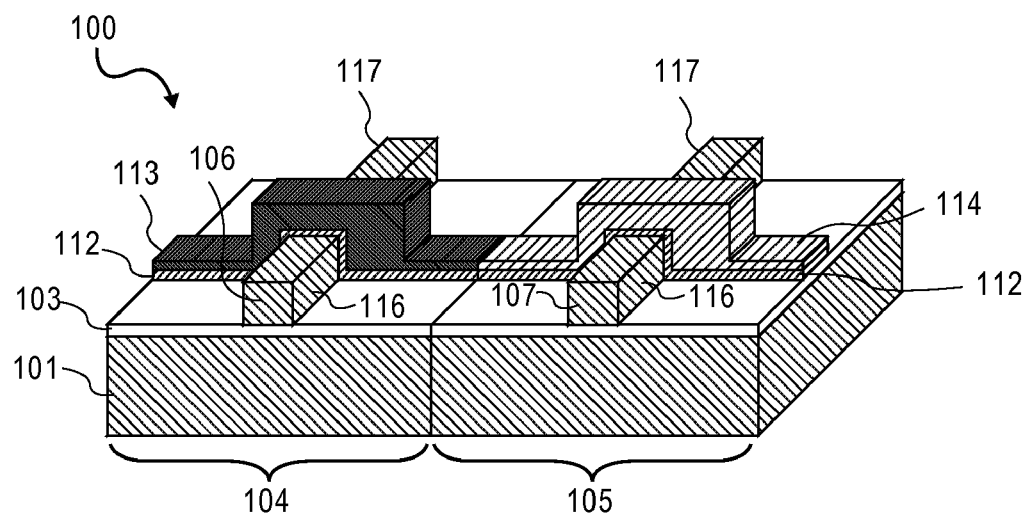
FIG. 1 is an illustration of a perspective view of conventional non-planar transistors on an insulating substrate and conventional gate electrodes.
Figure 2A:
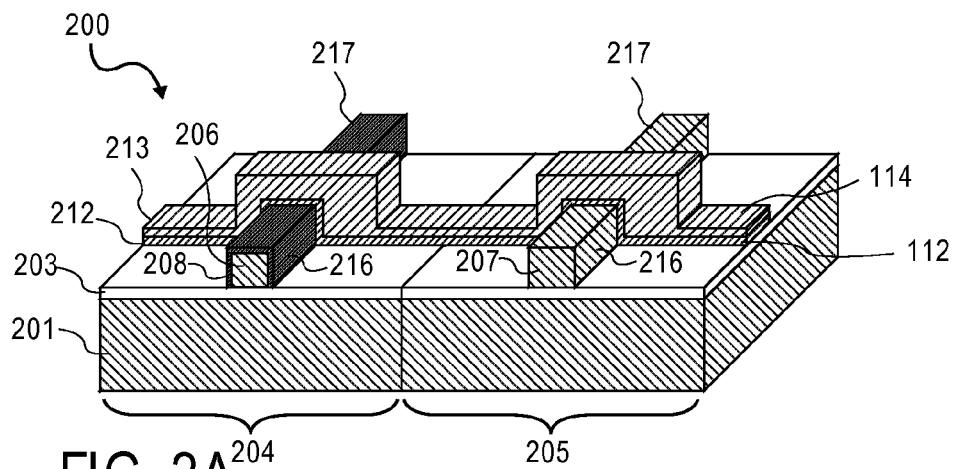
FIG. 2A is an illustration of a perspective view of non-planar transistors on an insulating substrate and gate electrodes in accordance with the present invention.

An example of a CMOS device 200 with a metal gate structure and an engineered band gap in accordance with an embodiment of the present invention is illustrated in FIG. 2A. Although FIG. 2A shows a tri-gate embodiment of the present invention, it should be appreciated that additional embodiments comprising single-gate or multi-gate transistors (such as dual-gate, FinFET, omega-gate) designs are also possible. CMOS device 200 comprises a transistor of a first type on a first region 204 on a first region and a transistor of a complementary type on a second region 205 of substrate 202. Embodiments of the present CMOS invention utilize a cladding 208 as a component of the device in region 204. When the cladding 208 is formed of a semiconductor having a narrower band gap than the semiconductor body 206, the effective threshold voltage of pMOS transistor in region 204 will be reduced by an amount approximately equal to the valence band offset between the semiconductor cladding 208 and the semiconductor body 206. Similarly, any conduction band offset between the cladding material the underlying semiconductor body would likewise modify the effective threshold voltage of an nMOS transistor. In a further embodiment, a semiconductor body having a larger band gap can be used to increase either a pMOS or an nMOS transistor's threshold voltage by the respective band offset relative to the unclad substrate on which the transistors are formed in order to reduce transistor leakage or increase a transistor's breakdown voltage.

In alternate embodiments of the present invention (not shown) both the pMOS transistor and nMOS transistor comprise a semiconductor cladding material having a band offset relative to the substrate semiconductor. When the cladding material has only a valence band offset (no conduction band offset) relative to the substrate, the cladding layer on the nMOS transistor will not have any effect on the nMOS threshold voltage.

In a particular embodiment of the present invention, as shown in FIG. 2A, device 200 includes non-planar monocrystalline semiconductor bodies 206 and 207 on insulating layer 203 over carrier 201. Semiconductor bodies 206 and 207 can be formed of any well-known semiconductor material, such as silicon (Si), gallium arsenide (GaAs), indium antimonide (InSb), gallium antimonide (GaSb), gallium phosphide (GaP), or indium phosphide (InP). For embodiments where monocrystalline silicon is formed on insulator 203, the structure is commonly referred to as silicon/semiconductor-on-insulator, or SOI, substrate. In an embodiment of the present invention, the semiconductor film on insulator 203 is comprised of a monocrystalline silicon semiconductor doped with either p-type or n-type conductivity with a concentration level between $1 \times 1016$-$1 \times 1019$ atoms/cm3. In another embodiment of the present invention, the semiconductor film formed on insulator 203 is comprised of a silicon semiconductor substrate having an undoped, or intrinsic epitaxial silicon region. Insulator 203 can be any dielectric material and carrier 201 can be any well-known semiconductor, insulator or metallic material.

Figure 2B:
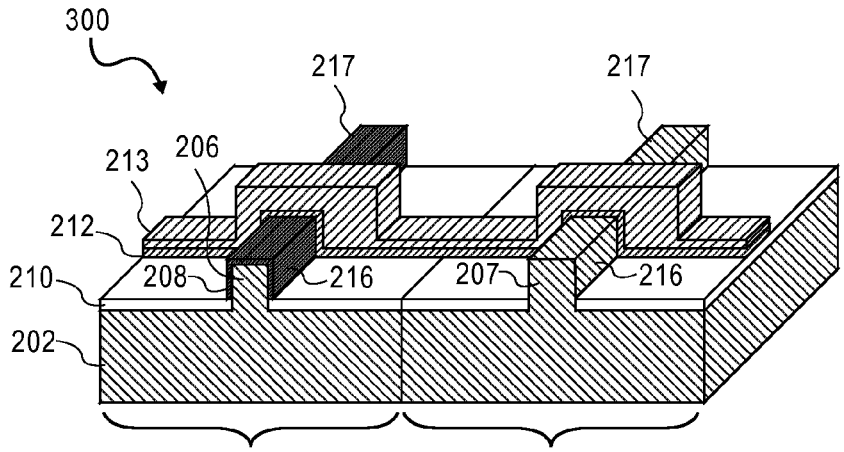
FIG. 2B is an illustration of a perspective view of non-planar transistors on a bulk substrate and gate electrodes in accordance with the present invention.

In another embodiment of the invention, as shown in device 300 of FIG. 2B, a "bulk" substrate is used and semiconductor bodies 206 and 207 are formed on an upper region of the "bulk" semiconductor substrate. In an embodiment of the present invention, the substrate 202 is comprised of a silicon semiconductor substrate having a doped epitaxial silicon region with either p-type or n-type conductivity with a concentration level between $1 \times 1016$-$1 \times 1019$ atoms/cm3. In another embodiment of the present invention, the substrate 202 is comprised of a silicon semiconductor substrate having an undoped, or intrinsic epitaxial silicon region. In bulk substrate embodiments of the present invention, isolation regions 210 are formed on the bulk, monocrystalline, semiconductor and border the semiconductor bodies 206 and 207, as shown in FIG. 2B. In some embodiments, at least a portion of the sidewalls of the bodies 206 and 207 extend above the bordering isolation regions 210. In other embodiments, such as for planar single-gate designs, the semiconductor bodies 206 and 207 have only a top surface exposed.

In embodiments shown in both FIGS. 2A and 2B, semiconductor bodies 206 and 207 have a pair of opposite sidewalls separated by a distance defining an individual semiconductor body width. Additionally, semiconductor bodies 206 and 207 have a top surface opposite a bottom surface formed over substrate 202. In embodiments with an insulating substrate, semiconductor bodies 206 and 207 are in contact with the insulating layer shown in FIG. 2A. In embodiments with a bulk substrate, semiconductor bodies 206 and 207 are in contact with the bulk semiconductor substrate and the bottom surface of the body is considered to be planar with the bottom surface of the isolation region 210 bordering the body, as shown in FIG. 2B. The distance between the top surface and the bottom surface defines an individual semiconductor body height. In an embodiment of the present invention, the individual body height is substantially equal to the individual semiconductor body width. In a particular embodiment of the present invention, the semiconductor bodies 206 and 207 have a width and height less than 30 nanometers, and more particularly, less than 20 nanometers. In another embodiment of the present invention, the individual semiconductor body height is between half the individual semiconductor body width and twice the individual semiconductor body width. In still other embodiments of the present invention, a planar or single-gate transistor design (not shown) is formed on the substrate so that a gate dielectric and a gate electrode are formed only on a top surface of the semiconductor regions.

The semiconductor cladding 208 is ideally capable of remaining single crystalline with the semiconductor body 206 to ensure sufficient carrier lifetime and mobility, as the cladding 208 comprises the channel region of pMOS transistor 204. Semiconductor cladding 208 can be formed of any well-known semiconductor material, such as silicon germanium (SiGe), indium gallium arsenide (InxGa1-xAsy), indium antimonide (InxSby), indium gallium phosphide (InxGa1-xPy), or carbon nanotubes (CNT). In certain embodiments of the present invention where the semiconductor of bodies 206 and 207 are silicon, the semiconductor material used for the cladding 208 is SiGe. In certain other embodiments, one semiconductor body is silicon and the cladding layer is an alloy of silicon and carbon (SiC). In other embodiments of the present invention having a planar or single-gate transistor design (not shown), the cladding layer is formed directly on and adjacent to a top surface of the active semiconductor region over the substrate. In certain embodiments of the present invention having a multi-gate transistor design, as shown in FIGS. 2A and 2B, the cladding region 208 surrounds the semiconductor body 206, on and adjacent to all free semiconductor surfaces. In an embodiment of the present invention the cladding region 208 has a thickness between about 5 and about 300 angstroms, and more particularly, between about 30 and about 200 angstroms.

In certain embodiments of the present invention, the cladding 208, as shown in FIGS. 2A and 2B, extends beyond the channel region and substantially covers the portions of the semiconductor body 206 that will become the source 216 and drain 217 regions of the pMOS transistor 204. In this manner it is possible to form germanicide source and drain contact region having a low conductivity and a low thermal activation temperature. In other embodiments of the present invention, the cladding 208 does not extend beyond the channel region under the gate insulator 212 and instead, the surfaces of the semiconductor body 206 are directly formed into source and drain regions.

Embodiments of the present invention include increasing the valence band energy of a pMOS transistor having a SiGe cladding region by increasing the concentration of the germanium. In this manner, it is possible to fabricate both a pMOS and nMOS multi-gate transistor having gate electrodes of the same material and threshold voltage magnitudes less than 0.7 V over a range of transistor channel doping levels. As the valence band energy increases, the threshold voltage is lowered by an amount approximately equal to the valance band voltage offset. In an embodiment of the present invention, the germanium concentration is between 5 and 50 percent, and more particularly, between 15 and 30 percent. For embodiments having about 25 percent germanium, the valence band energy is increased by about 300 mV above the valence band of silicon. Thus, a pMOS device having a SiGe channel region comprised of about 25 percent germanium will have a threshold voltage magnitude approximately 300 mV less than that of a pure silicon channel.

In embodiments of the present invention, nMOS multi-gate devices have a work function difference (the difference between the gate metal work function an the semiconductor work function or metal-semiconductor) of about 0.4 eV while the work function difference for a pMOS multi-gate device is about 0.7 eV. In a particular embodiment of the present invention, the 0.4 eV nMOS work function difference is achieved through Fermi-level pinning a mid-gap titanium nitride metal gate material (having a work function of about 4.7 eV). In a further embodiment of the present invention, a 0.7 eV pMOS work function difference is achieved with a band-engineered SiGe channel region comprised of about 25 percent germanium. The 25 percent germanium-cladding region increases the semiconductor valance band energy and, in effect, shifts the work function difference of the mid-gap titanium nitride metal gate material by about 300 mV, from the pinned Fermi-level of 0.4 eV to the desired 0.7 eV.

Figure 2C:
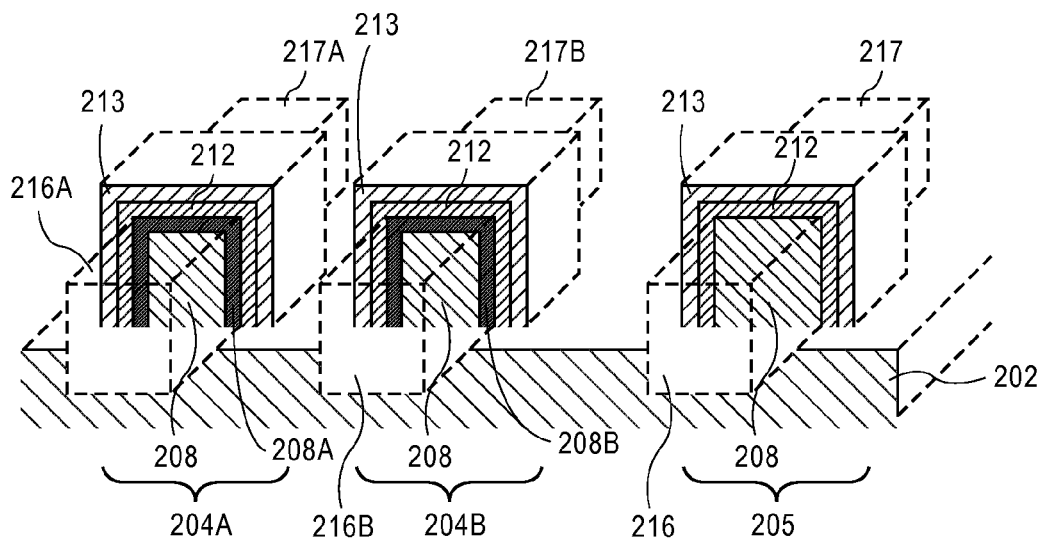
FIG. 2C is an illustration of a cross-sectional view of a non-planar transistors, in accordance with the present invention.

Embodiments of the present invention include adjusting the germanium concentration of a pMOS SiGe cladding region to adjust the threshold voltage, enabling multiple threshold voltages on the same chip, which is a different challenge from setting a single threshold voltage to match an nMOS device. For ULSI systems, it is typically necessary to provide a menu of devices with different threshold voltages to allow for the optimization of performance and power consumption. The ability to tune the threshold voltage by about 150 mV is often required. For devices with geometries in the sub-50-nm gate-length regime, it is very difficult to achieve such a range by merely doping the transistor channel. Disadvantageous channel doping can be avoided by embodiments of the present invention (e.g. illustrated in FIG. 2C) where a first pMOS device 204A has a cladding layer 208A comprised of a first germanium concentration targeting a first threshold voltage while a second pMOS device 204B has a cladding layer 208B comprised of a second germanium concentration targeting a second threshold voltage.

In the embodiments depicted in FIGS. 2A and 2B, CMOS devices 200 and 300, respectively, have a gate insulator layer 212. In the depicted embodiments, gate insulator 212 surrounds the cladding 208 of pMOS device 204 and the semiconductor body 207 of the nMOS device. In such tri-gate embodiments, gate dielectric layer 212 is formed on the sidewalls as well as on the top surfaces of the cladding 208 and semiconductor body 207, as shown in FIGS. 2A and 2B. In other embodiments, such as in FinFET or dual-gate designs, gate dielectric layer 212 is only formed on the sidewalls of the cladding 208 and sidewalls of semiconductor body 207. Gate insulator 212 can be of any commonly known dielectric material compatible with the cladding 208, semiconductor body 207 and the gate electrode 213. In an embodiment of the present invention, the gate dielectric layer is a silicon dioxide ($SiO_2$), silicon oxynitride ($SiO_xN_y$) or a silicon nitride ($Si_3N_4$) dielectric layer. In one particular embodiment of the present invention, the gate dielectric layer 212 is a silicon oxynitride film formed to a thickness of between 5-20 Å. In another embodiment of the present invention, gate dielectric layer 212 is a high K gate dielectric layer, such as a metal oxide dielectric, such as to tantalum oxide, titanium oxide, hafnium oxide, zirconium oxide, or aluminum oxide. Gate dielectric layer 212 can be other types of high K dielectric, such as lead zirconium titanate (PZT).

CMOS device embodiments 200 and 300 have a gate electrode 213, as shown in FIGS. 2A and 2B, respectively. In certain embodiments, gate electrode 213 is formed on and adjacent to gate dielectric layer 212, adjacent to gate insulator 212 formed on and adjacent to sidewalls of each of the semiconductor bodies 206 and 207. Gate electrode 213 has a pair of laterally opposite sidewalls separated by a distance, defining the gate length (Lg) of pMOS transistor in region 204 and nMOS transistor in region 205. In certain embodiments of the present invention, where the transistors in regions 204 and 205 are planar or single-gate devices (not shown), the gate electrode is merely on and adjacent to a top surface of the gate insulator over the semiconductor substrate. In the embodiments of the present invention, as shown in FIGS. 2A and 2B, the same material is used to form the gate electrode 213 for pMOS device in region 204 and nMOS device in region 205. In this manner, CMOS device fabrication can be greatly simplified because there is no need for the pMOS device to have a gate metal with a different work function than that of the nMOS device. In further embodiments of the present invention, the same gate electrode structure physically connects a pMOS device 204 to an nMOS device 205. Gate electrode 213 of FIGS. 2A and 2B can be formed of any suitable gate electrode material having the appropriate work function. In an embodiment of the present invention, the gate electrode is a metal gate electrode, such as tungsten, tantalum nitride, titanium nitride or titanium silicide, nickel silicide, or cobalt silicide. In an embodiment of the present invention, the gate electrode 213 of both the pMOS device and then nMOS device is formed from a material having a mid-gap work function between 4.5 and 4.9 eV. In a specific embodiment of the present invention, gate electrode 213 comprises titanium nitride having a work function equal to about 4.7 eV. It should also be appreciated that the gate electrode 213 need not necessarily be a single material, but rather can also be a composite stack of thin films such as a metal/polycrystalline silicon electrode.

As shown in FIG. 2A and 2B, a pair of source 216 drain 217 regions are formed in body 206 and 207 on opposite sides of gate electrode 213. The source region 216 and the drain region 217 are formed of the same conductivity type such as n-type or p-type conductivity, depending on if the transistor is an nMOS device or a pMOS device. In an embodiment of the present invention, source region 216 and drain region 217 have a doping concentration of $1\times10^{19}$-$1\times10^{21}$ atoms/cm3. Source region 216 and drain region 217 can be formed of uniform concentration or can include subregions of different concentrations or doping profiles such as tip regions (e.g., source/drain extensions).

As shown in FIGS. 2A and 2B, the portion of semiconductor cladding 208 and semiconductor body 207 located between source regions 216 and drain regions 217 define the channel region of the pMOS device in region 204 and nMOS device in 205. In certain embodiments of the present invention, the channel region of the cladding 208 on the pMOS device in region 204 is undoped SiGe. In other embodiments the channel region of the cladding 208 is doped SiGe. In an embodiment of the present invention, the channel region of semiconductor body 207 is intrinsic or undoped monocrystalline silicon. In an embodiment of the present invention, channel region of semiconductor body 207 is doped monocrystalline silicon. When the channel region is doped, it is typically doped to the opposite conductivity type of the source region 216 and the drain region 217. For example, the nMOS device in region 205 has source and drain regions which are n-type conductivity while the channel region is doped to p-type conductivity. When channel region is doped, it can be doped to a conductivity level of between $1\times10^{16}$ to $1\times10^{19}$ atoms/cm3. In certain multi-gate transistor embodiments of the present invention, the pMOS channel regions have an impurity concentration of 1017 to 10e18 atoms/cm3.

A method of fabricating a CMOS device on an insulating substrate in accordance with an embodiment of the present invention as shown in FIG. 2A is illustrated in FIGS. 3A-3F. Insulating substrate can be formed in any commonly known fashion. In an embodiment of the present invention, shown in FIG. 3A, the insulating substrate includes a lower monocrystalline silicon carrier 201 formed on an insulating layer 203, such as a silicon dioxide film or silicon nitride film. Insulating layer 203 isolates semiconductor film 315 from carrier 201, and in an embodiment is formed to a thickness between 200-2000 Å. Insulating layer 203 is sometimes referred to as a "buried oxide" layer and the substrate comprised of 201, 203 and 315 is referred to as a silicon or semiconductor on insulating (SOI) substrate.

Although the semiconductor film 315 is ideally a silicon film, in other embodiments it can be other types of semiconductor films, such as germanium (Ge), a silicon germanium alloy (SiGe), gallium arsenide (GaAs), InSb, GaP, GaSb, or InP. In an embodiment of the present invention, semiconductor film 315 is an intrinsic (i.e., undoped) silicon film. In other embodiments, semiconductor film 315 is doped to p-type or n-type conductivity with a concentration level between $1\times10^{16}$-$1\times10^{19}$ atoms/cm3. Semiconductor film 315 can be in-situ doped (i.e., doped while it is deposited) or doped after it is formed on substrate 202 by for example ion-implantation. Doping after formation enables complementary devices 204 and 205 to be fabricated easily on the same substrate. The doping level of the semiconductor substrate film 315 at this point can determine the doping level of the channel region of the device.

In certain embodiments of the present invention, semiconductor substrate film 315 is formed to a thickness approximately equal to the height desired for the subsequently formed semiconductor body or bodies of the fabricated transistor. In an embodiment of the present invention, semiconductor substrate film 315 has a thickness or height of less than 30 nanometers and ideally less than 20 nanometers. In certain embodiments of the present invention, semiconductor substrate region 315 is formed to a thickness enabling the fabricated transistor to be operated in a fully depleted manner for its designed gate length (Lg).

Semiconductor substrate region 315 can be formed on insulator 203 in any well-known method. In one method of forming a silicon-on-insulator substrate, known as the separation by implantation of oxygen (SIMOX) technique. Another technique currently used to form SOI substrates is an epitaxial silicon film transfer technique generally referred to as bonded SOI.

A masking layer 310 is used to define the active regions of the devices in regions 204 and 205. The masking layer can be any well-known material suitable for defining the semiconductor film 315. In an embodiment of the present invention, masking layer 310 is a lithographically defined photo resist. In another embodiment, 310 is formed of a dielectric material that has been lithographically defined and then etched. In a certain embodiment, masking layer can be a composite stack of materials, such as an oxide/nitride stack. As shown in FIG. 3B, once masking layer 310 has been defined, semiconductor 315 is then defined by commonly any known etching technique to form semiconductor bodies 206 and 207. In certain embodiments of the present invention anisotropic plasma etch, or RIE, is used to define semiconductor bodies 206 and 207. For planar, or single-gate embodiments, non-planar bodies 206 and 207 are not formed, rather the planar device is merely formed on the film 315 and mask 310 is used to define isolation regions. In an embodiment of the present invention, as shown in FIG. 3C, masking layer 310 is removed from the semiconductor bodies 206 and 207 using commonly known techniques that depend on the material selected for masking layer 310. In other embodiments, such as for particular dual-gate or FinFET designs, masking layer 310 is not removed.

If desired, a masking can be formed over any regions of the substrate where there is to be no semiconductor cladding layer. As shown, in FIG. 3D, mask layer 320 is formed over the nMOS device region 205. Mask layer 320 can be of any commonly known material capable of surviving the subsequent process of forming the semiconductor cladding layer. In an embodiment of the present invention, mask layer 320 is a dielectric material capable of serving as a good diffusion barrier, such as silicon nitride. Hard mask 320 ideally has good conformality so that semiconductor body 207 is completely encapsulated by the protective mask 20. Commonly known techniques, such as CVD, LPCVD, or PECVD may be used to deposit the mask material. Mask 320 is then selectively defined by commonly known lithographic and etch techniques, so that the mask 320 is substantially removed from the pMOS region leaving no spacer material or stringers along the semiconductor body 206. In certain embodiments of the present invention, when the semiconductor cladding layer is to be formed on all transistors, no mask layer 320 is formed.

Figure 3A:
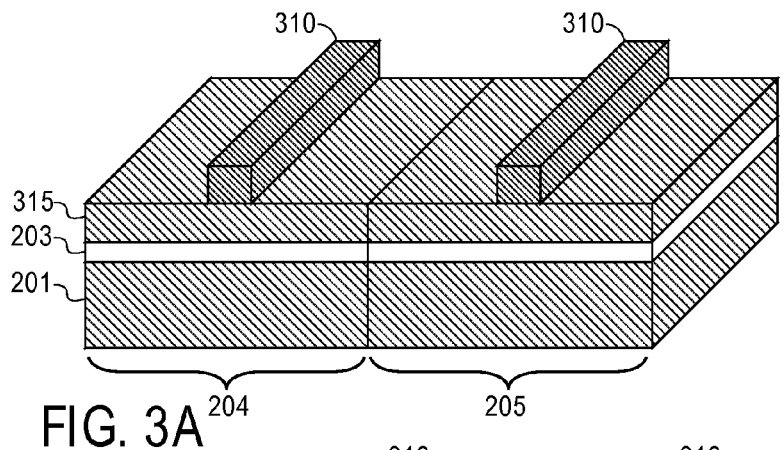
FIGS. 3A-3F are illustrations of perspective views of a method of fabricating non-planar transistors on an insulating substrate with gate electrodes in accordance with the present invention.
Figure 3B:
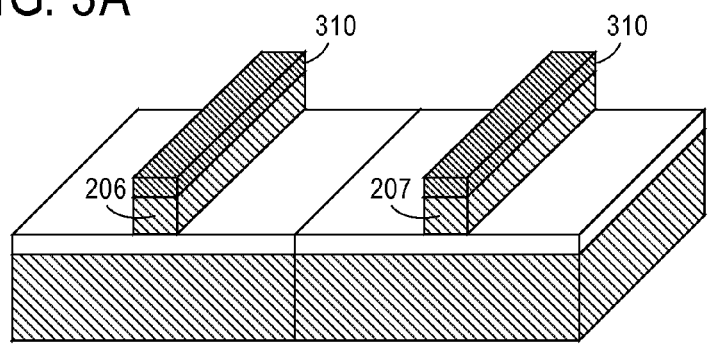
Figure 3C:
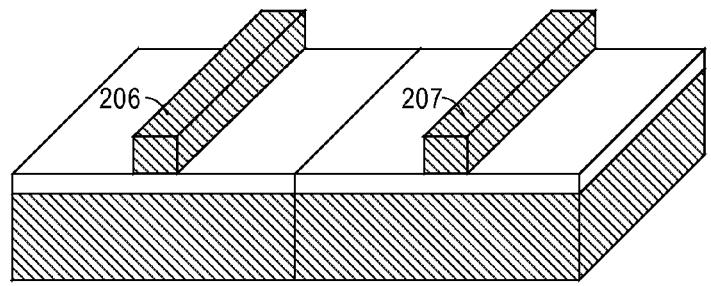
Figure 3D:
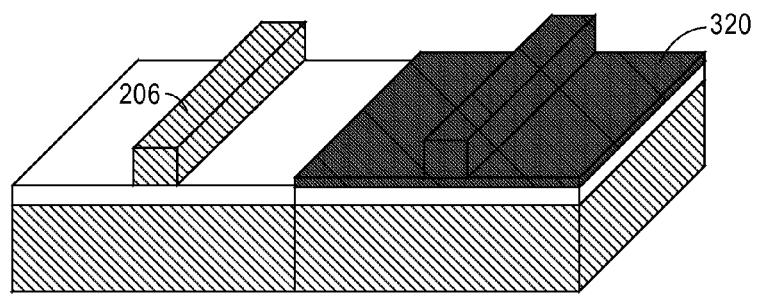
Figure 3E:
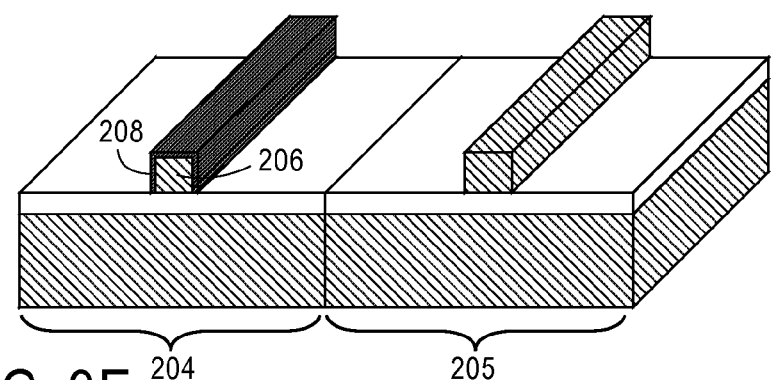

In certain embodiments, semiconductor cladding layer 208 is selectively formed on the semiconductor body 206 of the pMOS device 204, as shown in FIG. 3E. Any commonly known epitaxial processes suitable for the particular semiconductor materials can be used to form the semiconductor cladding layer on the semiconductor body 206. In a particular embodiment, an LPCVD process using germane and a silane as precursors forms a SiGe cladding on a silicon semiconductor body. In still another embodiment, a silicon cladding layer is formed on a SiGe body to form an nMOS device. The cladding layer can be grown to have a particular composition determined by the amount of band offset desired. In a particular embodiment of the present invention a silicon germanium cladding layer having about 25 percent to about 30 percent germanium is formed. In other embodiments, the germanium concentration is about 50 percent. Ideally, the formation process is capable of producing a single crystalline cladding 208 from the semiconductor body 206 seed layer. In an embodiment of the present invention the cladding layer is epitaxially grown on both the top surface and the sidewalls of the semiconductor body 206. In another embodiment where the top surface of semiconductor body 206 is protected by a dielectric, the cladding layer is only grown on and adjacent to the sidewalls. In still other embodiments, when the transistor is a planar design, the cladding layer is grown only on the top surface. The semiconductor cladding layer is grown to the desired thickness, some embodiments including in-situ impurity doping. In certain embodiments where the semiconductor cladding 208 is not lattice matched to the semiconductor body 206, the maximum cladding thickness is the critical thickness. In an embodiment of the present invention, a SiGe cladding is grown to a thickness of 5-300 Å. Once the cladding 208 is formed, the mask layer 320 protecting the nMOS region 205 is removed by commonly known techniques, as shown in FIG. 3E. In still other embodiments of the present invention, semiconductor cladding 208 is formed on both the pMOS device 204 and the nMOS device 205.

In certain embodiments of the present inventions, various regions over the substrate are selectively and iteratively masked and different pMOS devices (e.g. 204A and 204B in FIG. 2C) clad with semiconductor layers having different band offsets (e.g. 208A and 208B in FIG 2C), thereby providing pMOS devices (e.g. 204A and 204B in FIG. 2C) with various voltage threshold characteristics.

Figure 3F:
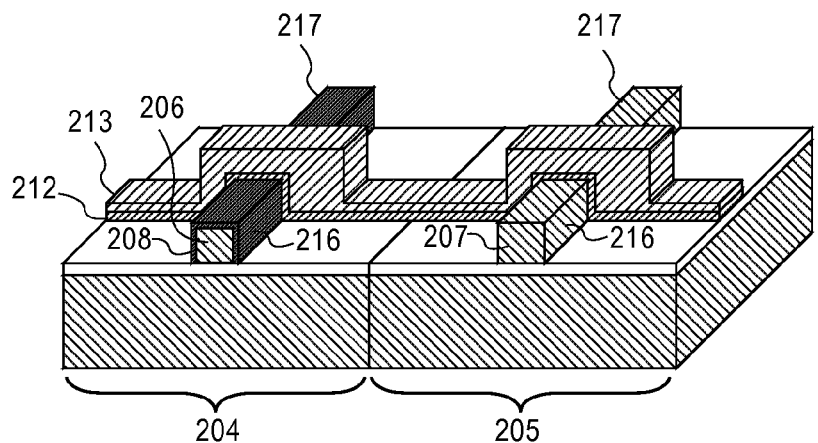

A gate dielectric layer 212, as shown in FIG. 3F, is formed on each of the cladding 208 and semiconductor body 207 in a manner dependent on the type of device (single-gate, dual-gate, tri-gate, etc.). In an embodiment of the present invention, a gate dielectric layer 212 is formed on the top surface of each of the semiconductor bodies 206 and 207, as well as on the laterally opposite sidewalls of each of the semiconductor bodies. In certain embodiments, such as dual-gate embodiments, the gate dielectric is not formed on the top surface of the cladding 208 or semiconductor body 207. The gate dielectric can be a deposited dielectric or a grown dielectric. In an embodiment of the present invention, the gate dielectric layer 212 is a silicon dioxide dielectric film grown with a dry/wet oxidation process. In an embodiment of the present invention, the gate dielectric film 212 is a deposited high dielectric constant (high-K) metal oxide dielectric, such as tantalum pentaoxide, titanium oxide, hafnium oxide, zirconium oxide, aluminum oxide, or another high-K dielectric, such as barium strontium titanate (BST). A high-K film can be formed by well-known techniques, such as chemical vapor deposition (CVD) and atomic layer deposition (ALD).

As shown in FIG. 3F, a gate electrode 213 is formed on both the pMOS and nMOS devices. In certain embodiments, the same gate electrode material is used for both the pMOS device in region 204 and nMOS device in region 205, but it is not necessarily so as other advantages of the present invention have been described. In an embodiment of the present invention, the gate electrode 213 is formed on the gate dielectric layer 212 formed on and adjacent to the top surface of each of the cladding 208 or semiconductor body 207 and is formed on and adjacent to the gate dielectric 212 formed on and adjacent to the sidewalls of each of the cladding 208 or semiconductor body 207. The gate electrode can be formed to a thickness between 200-3000 Å. In an embodiment, the gate electrode has a thickness of at least three times the height of the semiconductor bodies 206 and 207. In an embodiment of the present invention, the gate electrode is a mid-gap metal gate electrode such as, tungsten, tantalum nitride, titanium nitride or titanium silicide, nickel silicide, or cobalt silicide. In an embodiment of the present invention gate electrode 213 is simultaneously formed for both the pMOS device in region 204 and nMOS device in region 205 by well-known techniques, such as blanket depositing a gate electrode material over the substrate of and then patterning the gate electrode material for both the pMOS and nMOS devices through photolithography and etch. In other embodiments of the present invention, "replacement gate" methods are used to form both the pMOS and nMOS gate electrodes 213, concurrently or otherwise.

Source regions 216 and drain regions 217 for the transistor are formed in semiconductor bodies 206 and 207 on opposite sides of gate electrode 213, as shown in FIG. 3F. In an embodiment of the present invention, the source and drain regions include tip or source/drain extension regions. For a pMOS transistor, the semiconductor fin or body 206 is doped to p-type conductivity and to a concentration between $1 \times 10^{19} - 1 \times 10^{21}$ atoms/cm3. For an nMOS transistor, the semiconductor fin or body 207 is doped with n-type conductivity ions to a concentration between $1 \times 10^{19} - 1 \times 10^{21}$ atoms/cm3. At this point the CMOS device of the present invention is substantially complete and only device interconnection remains.

A method of fabricating a CMOS device on a bulk substrate in accordance with an embodiment of the present invention as shown in FIG. 2B is illustrated in FIGS. 4A-4F. In certain embodiments of the present invention, the substrate 202 of FIG. 4A can be a "bulk" semiconductor substrate, such as a silicon monocrystalline substrate or gallium arsenide substrate. The method of fabrication on a bulk substrate in accordance with an embodiment of the present invention is similar to the method of fabrication previously described for an SOI structure in reference to FIG. 3A-3F. In certain embodiments of the present invention, the substrate 202 is a silicon semiconductor substrate, upon which there is a doped epitaxial region with either p-type or n-type conductivity with an impurity concentration level between $1 \times 10^{16} - 1 \times 10^{19}$ atoms/cm3. In another embodiment of the present invention the substrate 202 is a silicon semiconductor substrate upon which there is an undoped, or intrinsic epitaxial silicon region.

In embodiments of the present invention, well regions of semiconductor substrate 202 are doped to p-type or n-type conductivity with a concentration level between about 1×10¹⁶-1×10¹⁹ atoms/cm3. Semiconductor substrate 202 can be doped by, for example, ion-implantation enabling both pMOS and nMOS well regions to be fabricated easily on the same substrate. The doping level of the semiconductor substrate 202 at this point can determine the doping level of the channel region of the device.

Figure 4A:
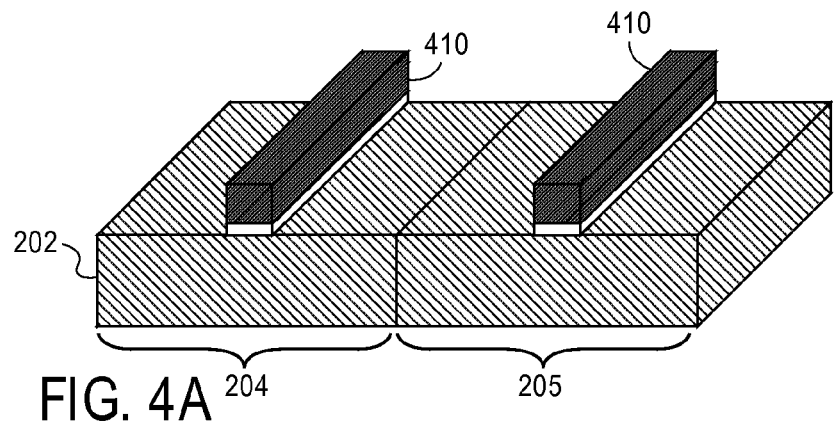
FIGS. 4A-4F are illustrations of perspective views of a method of fabricating non-planar transistors on a bulk substrate with gate electrodes in accordance with the present invention.

As shown in FIG. 4A, a masking layer 410, like masking layer 310 in FIG. 3A, is used to define the active regions of the pMOS device 204 and the nMOS device 205 on the bulk semiconductor substrate. The method of forming masking layer 410 can be essentially the same as those described for masking layer 310 of FIG. 3A.

Figure 4B:
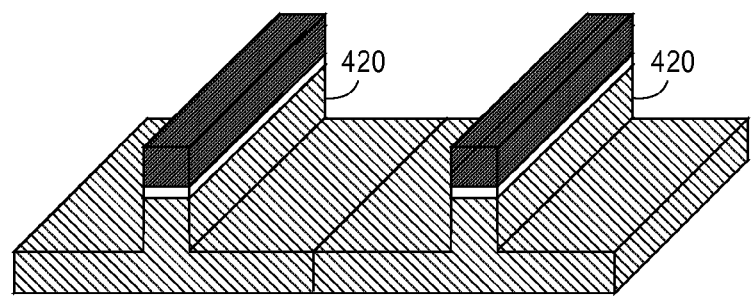
Figure 4C:
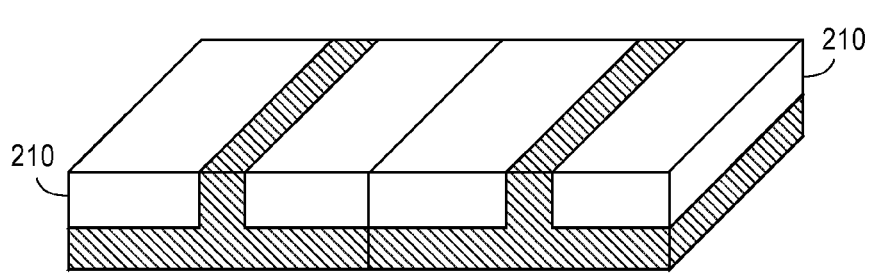

As shown in FIG. 4B, the bulk semiconductor is etched using commonly known methods, very similar to those previously described for layer 315 of to SOI substrate shown FIG. 3B, to form recesses or trenches 420 on the substrate in alignment with the outside edges of masking portion 410. The trenches 420 are etched to a depth sufficient to isolate adjacent transistor from one another. As shown in FIG. 4C, the trenches 420 are filled with a dielectric to form shallow trench isolation (STI) regions 210 on substrate 202. In an embodiment of the present invention, a liner of oxide or nitride on the bottom and sidewalls of the trenches 420 is formed by commonly known methods. Next, the trenches 420 are filled by blanket depositing an oxide over the liner by, for example, a high-density plasma (HDP) chemical vapor deposition process. The deposition process will also form dielectric on the top surfaces of the mask portions 410. The fill dielectric layer can then be removed from the top of mask portions 410 by chemical, mechanical, or electrochemical, polishing techniques. The polishing is continued until the mask portions 410 are revealed, forming STI regions 210. In an embodiment of the present invention, as shown in FIG. 4C, the mask portions 410 are selectively removed at this time. In other embodiments, the mask portions 410 are retained through subsequent processes.

Figure 4D:
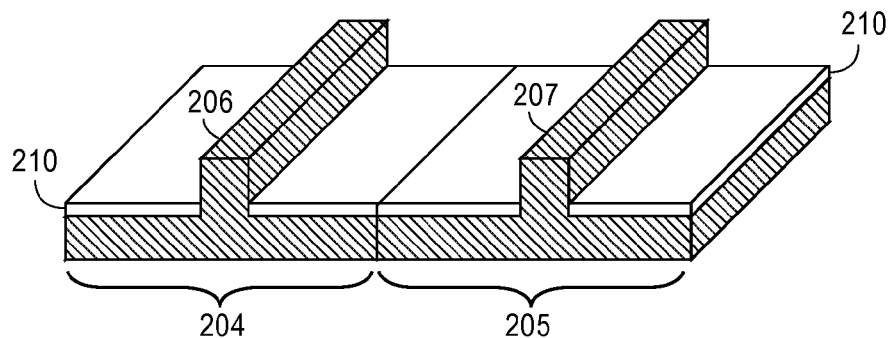

In certain embodiments, as shown in FIG. 4D, the STI regions 210 are etched back or recessed to form the sidewalls of the semiconductor bodies 206 and 207. STI regions 210 are etched back with an etchant, which does not significantly etch the semiconductor bodies 206 and 207. In embodiments where semiconductor bodies are silicon, isolation regions 210 can be recessed with an etchant comprising a fluorine ion, such as HF. In other embodiments, STI regions 210 are recessed using a commonly known anisotropic etch followed by an isotropic etch to completely remove the STI dielectric from the sidewalls of the semiconductor bodies 206 and 207. STI regions 210 are recessed by an amount dependent on the desired channel width of the transistors formed in regions 204 205. In an embodiment of the present invention STI regions 210 are recessed by approximately the same amount as the smaller, or width, dimension of the top surface of the semiconductor bodies 206 and 207. In other embodiments the STI regions 210 are recessed by a significantly larger amount than the width dimension of the top surface of the semiconductor bodies 206 and 207. In still other embodiments, the STI regions 210 are not recessed so that planar, or single-gate, devices can be formed.

Figure 4E:
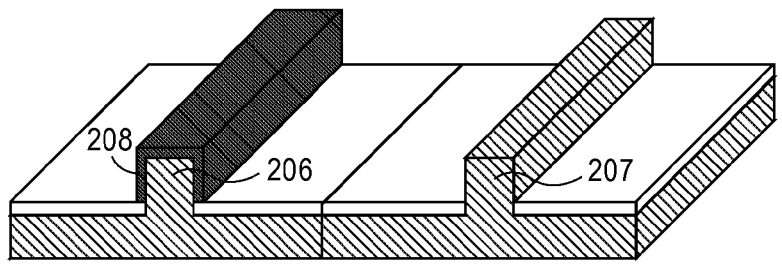
Figure 4F:
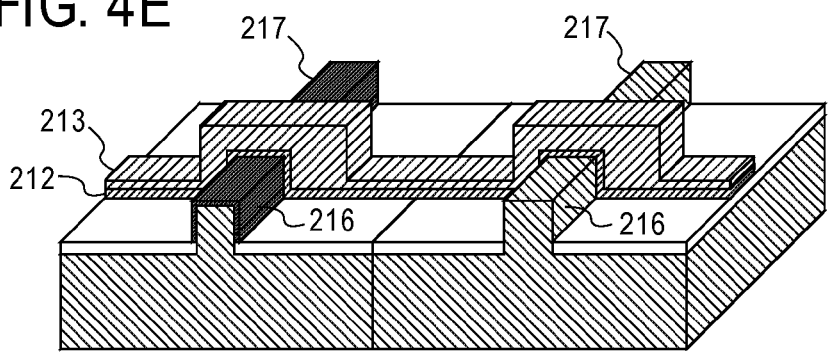

In certain embodiments, once the non-planar semiconductor bodies 206 and 207 are formed on the bulk substrate, the remaining fabrication operations are analogous to those previously described for the embodiments describing a non-planar transistors on an SOI substrate. FIG. 4E depicts the selective formation of the semiconductor cladding 208 on the semiconductor body 206 using the various techniques described previously in the context of FIGS. 3D and 3E for the SOI embodiments of the present invention. As described for the SOI embodiments, semiconductor cladding 208 may also be formed on semiconductor body 207, if desired. As shown in FIG. 4F, a gate insulator 212, gate electrode 213, source regions 216, and drain regions 217 are formed on both the device in region 204 and complementary device in region 205 following embodiments analogous to those previously described in the context of an SOI substrate. At this point the transistors of the present invention formed on a bulk substrate is substantially complete and only device interconnection remains.

Although the invention has been described in language specific to structural features and/or methodological acts, it is to be understood that the invention defined in the appended claims is not necessarily limited to the specific features or acts described. Rather, the specific features and acts are disclosed as particularly graceful implementations of the claimed invention.

What is claimed is:

1. A pair of pMOS transistors, comprising:
   a first SiGe channel region on a first region of a silicon substrate, the first SiGe channel region having a first concentration of Ge;
   a second SiGe channel region on a second region of the silicon substrate, the second SiGe channel region having a second concentration of Ge, different than the first concentration of Ge;
   a gate insulator on the first and second SiGe channel regions;
   a first gate electrode on the gate insulator over the first SiGe channel region;
   a second gate electrode on the gate insulator over the second SiGe channel region, wherein the first gate electrode and the second gate electrode have a same mid-gap work function to provide a first of the pair of pMOS transistors with a threshold voltage that is different than a second of the pair of pMOS transistors; and
   a p-type doped source and drain on opposite sides of both the first and second gate electrodes.

2. The pMOS transistors of claim 1, wherein the first and second SiGe channel regions are substantially free of dopant species.

3. The pMOS transistors of claim 1, wherein the first SiGe channel region further comprises a first cladding layer comprising the first germanium concentration on a first non-planar silicon body, and wherein the second SiGe channel region further comprises a second cladding layer comprising the second germanium concentration on a second non-planar silicon body, the first and second non-planar silicon bodies having a pair of opposite sidewalls separated by a distance defining a semiconductor body width.

4. The pMOS transistors of claim 3, wherein the gate insulator is formed on the sidewalls and on a top surface of the first and second cladding layers.

5. The pMOS transistors of claim 3, wherein the first and second cladding layer further comprise an epitaxial SiGe layer on the first and second non-planar silicon bodies.

6. The pMOS transistors of claim 5, wherein at least one of the first and second cladding layers have a thickness of between 5 Å and 300 Å and wherein at least one of the first or second concentration of Ge is between 25% and 30%.

7. The pMOS transistors of claim 1, wherein the first gate electrode and the second gate electrode further comprise a same material having a mid-gap work function between 4.5 and 4.9 eV.

8. The pMOS transistors of claim 7, wherein the first gate electrode and the second gate electrode further comprises a titanium nitride layer disposed on the gate insulator.

9. The pMOS transistors of claim 1, wherein the threshold voltage between the pair of pMOS transistors is differs by at least 150 mV.

10. The pMOS transistors of claim 1, wherein the gate insulator is a metal oxide dielectric layer.

11. A CMOS device, comprising
the pMOS transistors of claim 1, and
an nMOS transistor including a gate electrode of a material having a mid-gap work function between 4.5 and 4.9 eV.

12. The semiconductor device of claim 11, wherein the gate electrode comprises titanium nitride.

13. The semiconductor device of claim 11, wherein the nMOS transistor channel comprises monocrystalline silicon.

14. The semiconductor device of claim 11, wherein the nMOS transistor channel is undoped.

* * * * *